(12) United States Patent
Kajigaya

(10) Patent No.: US 8,509,020 B2
(45) Date of Patent: Aug. 13, 2013

(54) DATA PROCESSING SYSTEM

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 248 days.

(21) Appl. No.: 12/929,899

(22) Filed: Feb. 23, 2011

(65) Prior Publication Data

US 2011/0205824 A1 Aug. 25, 2011

(30) Foreign Application Priority Data

Feb. 25, 2010 (JP) ................................ 2010-040542

(51) Int. Cl.
  *G11C 7/00* (2006.01)
  *G11C 8/00* (2006.01)
(52) U.S. Cl.
  USPC ................. 365/219; 365/230.03; 365/189.05; 365/191; 365/198; 365/220; 365/221
(58) Field of Classification Search
  USPC ............... 365/219, 230.03, 189.05, 191, 198, 365/220, 221
  See application file for complete search history.

(56) References Cited

U.S. PATENT DOCUMENTS

| | | | |
|---|---|---|---|
| 6,795,889 B2 | 9/2004 | Berg et al. | |
| 7,054,202 B2* | 5/2006 | Lee et al. | 365/189.05 |
| 7,149,824 B2 | 12/2006 | Johnson | |
| 7,266,639 B2* | 9/2007 | Raghuram | 711/115 |

FOREIGN PATENT DOCUMENTS

JP 2006-252668 9/2006

* cited by examiner

*Primary Examiner* — Toan Le
*Assistant Examiner* — Hai Pham
(74) *Attorney, Agent, or Firm* — McGinn IP Law Group, PLLC

(57) ABSTRACT

A data processing system includes a first semiconductor device that has a plurality of blocks each including plural data, and a second semiconductor device that has a first control circuit controlling the first semiconductor device, and the first control circuit issues a plurality of commands to communicate with the first semiconductor device in units of access units including a plurality of first definitions that define a plurality of burst lengths indicating numbers of different data, respectively, and a plurality of second definitions that define correspondences between certain elements of data among the plural data included in the blocks, respectively, and arrangement orders in the numbers of different data that constitute the burst lengths, respectively, and communicates with the first semiconductor device through the plural data in the numbers of different data according to the first and second definitions.

20 Claims, 20 Drawing Sheets

| BURST OPERATION MODE | | BURST-MODE SET SIGNALS | | | | BLOCK SELECT SIGNALS | | | | START-BLOCK SELECT SIGNALS | | | | BURST-LENGTH SELECT SIGNALS | | | |
|---|---|---|---|---|---|---|---|---|---|---|---|---|---|---|---|---|---|
| START-BLOCK | BURST-LENGTH | A9 | A11 | A12 | A13 | BSA | BSB | BSC | BSD | STA | STB | STC | STD | BL4 | BL8 | BL12 | BL16 |
| A | 4 | 0 | 0 | 0 | 0 | 1 | 1 | 0 | 0 | 1 | 0 | 0 | 0 | 1 | 0 | 0 | 0 |
| A | 8 | 0 | 0 | 1 | 0 | 1 | 0 | 0 | 0 | 1 | 0 | 0 | 0 | 0 | 1 | 0 | 0 |
| A | 12 | 0 | 0 | 0 | 1 | 1 | 1 | 1 | 0 | 1 | 0 | 0 | 0 | 0 | 0 | 1 | 0 |
| A | 16 | 0 | 0 | 1 | 1 | 1 | 1 | 1 | 1 | 1 | 0 | 0 | 0 | 0 | 0 | 0 | 1 |
| B | 4 | 1 | 0 | 0 | 0 | 0 | 1 | 0 | 0 | 0 | 1 | 0 | 0 | 1 | 0 | 0 | 0 |
| B | 8 | 1 | 0 | 1 | 0 | 0 | 1 | 1 | 0 | 0 | 1 | 0 | 0 | 0 | 1 | 0 | 0 |
| B | 12 | 1 | 0 | 0 | 1 | 0 | 1 | 1 | 1 | 0 | 1 | 0 | 0 | 0 | 0 | 1 | 0 |
| B | 16 | 1 | 0 | 1 | 1 | 1 | 1 | 1 | 1 | 0 | 1 | 0 | 0 | 0 | 0 | 0 | 1 |
| C | 4 | 0 | 1 | 0 | 0 | 0 | 0 | 1 | 0 | 0 | 0 | 1 | 0 | 1 | 0 | 0 | 0 |
| C | 8 | 0 | 1 | 1 | 0 | 0 | 0 | 1 | 1 | 0 | 0 | 1 | 0 | 0 | 1 | 0 | 0 |
| C | 12 | 0 | 1 | 0 | 1 | 1 | 0 | 1 | 1 | 0 | 0 | 1 | 0 | 0 | 0 | 1 | 0 |
| C | 16 | 0 | 1 | 1 | 1 | 1 | 1 | 1 | 1 | 0 | 0 | 1 | 0 | 0 | 0 | 0 | 1 |
| D | 4 | 1 | 1 | 0 | 0 | 0 | 0 | 0 | 1 | 0 | 0 | 0 | 1 | 1 | 0 | 0 | 0 |
| D | 8 | 1 | 1 | 1 | 0 | 1 | 0 | 0 | 1 | 0 | 0 | 0 | 1 | 0 | 1 | 0 | 0 |
| D | 12 | 1 | 1 | 0 | 1 | 1 | 1 | 0 | 1 | 0 | 0 | 0 | 1 | 0 | 0 | 1 | 0 |
| D | 16 | 1 | 1 | 1 | 1 | 1 | 1 | 1 | 1 | 0 | 0 | 0 | 1 | 0 | 0 | 0 | 1 |

FIG.8

DATA PROCESSING SYSTEM

BACKGROUND OF THE INVENTION

1. Field of the Invention

The present invention relates to a data processing system and, for example, relates to a data processing system that has a burst function to enable a front end to output plural read data in serial, which are read in parallel from a back end including plural data and that can achieve a variety of burst functions.

2. Description of Related Art

As a DRAM (Dynamic Random Access Memory) which is a representative semiconductor memory having a back end and a front end, a synchronous type that performs output of read data or input of write data in synchronization with a clock signal is commonly used. Many of the synchronous DRAMs can perform a burst operation to continuously output plural read data, which are transferred from a back end with a memory function, via a front end in synchronization with a clock signal, or continuously input plural write data via the front end to transfer the data to the back end in synchronization with a clock signal. The number of output bits of continuous read data during a read operation or the number of input bits of continuous write data during a write operation is usually called "burst length".

Setting of a burst length is usually performed by setting a desired value in a mode register included in a semiconductor memory. However, to change a set value in the mode register, a mode-register set command needs to be executed and therefore the burst length cannot be changed for each access in this method. To solve this problem, Japanese Patent Application Laid-open No. 2006-252668 and U.S. Pat. No. 7,149,824 propose a semiconductor memory that can specify a burst length for each access. U.S. Pat. No. 6,795,889 proposes a semiconductor memory that can set a burst length smaller than the number of prefetch data that are read from a memory cell array as a back end.

However, the present inventors have noted a problem that it is difficult to apply the semiconductor memory described in the above patent documents to semiconductor memories having a data bus with low use efficiency or high-speed semiconductor memories that are recently used. That is, as shown in FIG. 1A of Japanese Patent Application Laid-open No. 2006-252668, when an interval between read accesses 1 and 2 is set rather long, a period in which a data bus is not used occurs from the end of a burst operation corresponding to the read access 1 until the start of a burst operation corresponding to the read access 2, which reduces use efficiency of the data bus. To prevent occurrence of the nonuse period of the data bus, intervals between read accesses 1 to 3 need to be shortened as shown in FIG. 1B of Japanese Patent Application Laid-open No. 2006-252668. However, a memory controller in a current high-speed data processing system cannot issue commands at such short intervals. Furthermore, even if the controller can issue the commands at the short intervals, a back end having a lower operation frequency than that of a front end cannot follow. Dealing therewith by increasing the number of prefetches of plural data to be applied to a well-known back end has a limitation due to an increase in power consumption, increases in the number of internal data buses and the number of internal pipelines and the like. For example, a clock frequency of a currently fastest DRAM (a frequency of a data processing system) is about 1 GHz and, in this case, one clock cycle is 1 ns (nanosecond). This indicates that setting of the interval between the read accesses 2 and 3 to one clock cycle as shown in FIG. 1B of Japanese Patent Application Laid-open No. 2006-252668 is unfeasible in the technical concept of the current data processing system. Furthermore, it is desired that a frequency of a data processing system higher than 1 GHz, be also handled.

In addition, the semiconductor device and the data processing system described in the above patent documents can merely change a burst length for each access and cannot realize a variety of burst functions, for example, to enable the front end to rearrange plural read data to be burst-outputted.

SUMMARY

In one embodiment, there is provided a data processing system comprising: a first semiconductor devise that includes a plurality of blocks each storing a plurality of data; and a second semiconductor device that includes a first control circuit controlling the first semiconductor device, wherein the first control circuit issues a command including first and second definitions to the first semiconductor device each time the second semiconductor device is to communicate with the first semiconductor device, the first definition defining a burst length that indicates bit number of access data that are inputted to or outputted from the first semiconductor device per one command, and the second definition defining an arrangement order of the access data in units of unit data that corresponds to one block.

According to the present invention, the data processing system has information for rearranging read data that are read from the plurality of blocks rapidly and with small-sized elements, for example. Therefore, it is possible to provide a data processing system that realizes a variety of burst functions.

BRIEF DESCRIPTION OF THE DRAWINGS

The above features and advantages of the present invention will be more apparent from the following description of certain preferred embodiments taken in conjunction with the accompanying drawings, in which:

FIG. 8 is a truth table showing a relationship among burst-mode set signals, block select-signals, start-block select signals, and burst-length select-signals;

DETAILED DESCRIPTION OF THE EMBODIMENTS

Figure 5:
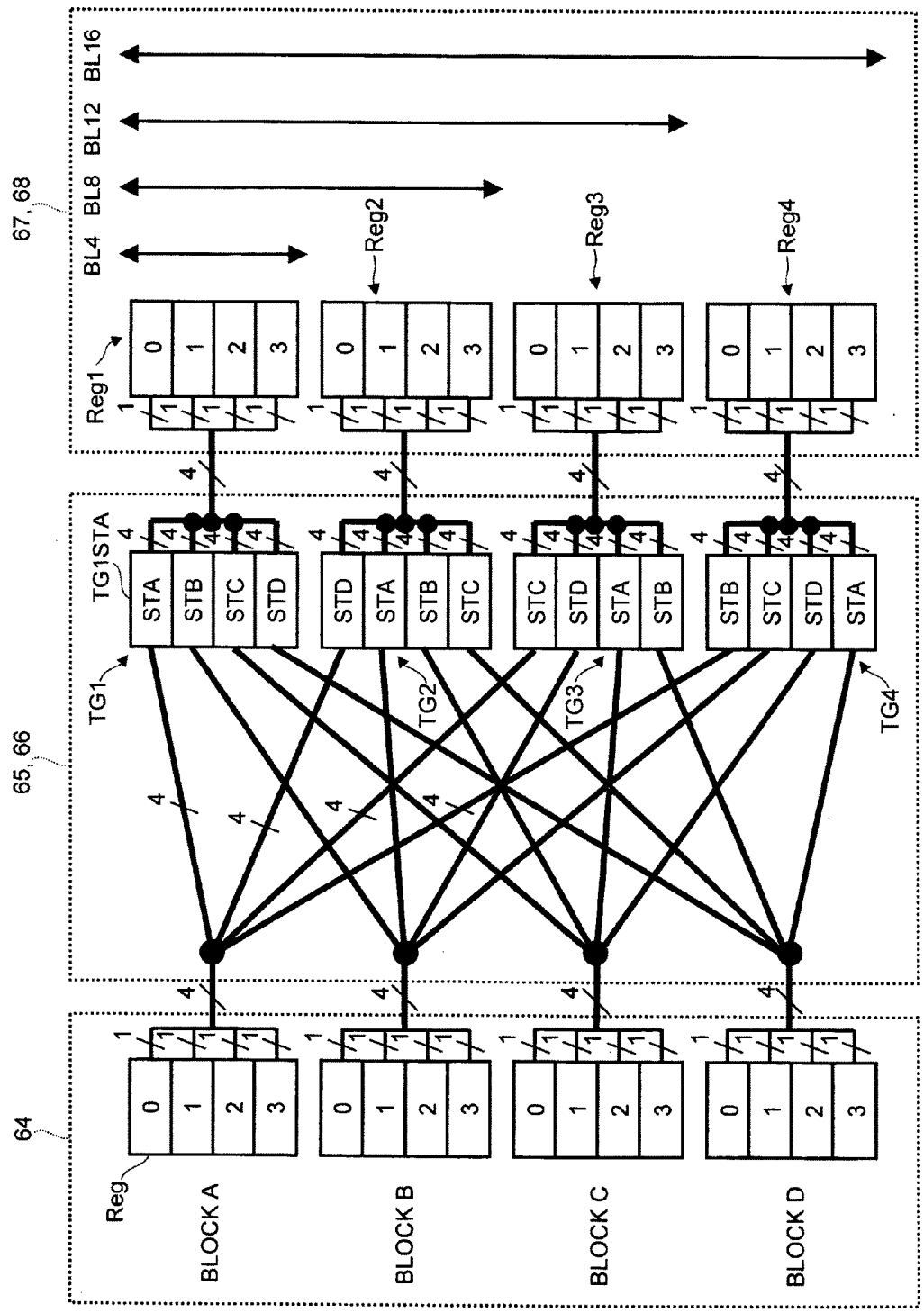
FIG. 5 is a diagram schematically shows a portion of the system related to 16-bit data to be assigned to one data input/output terminal 14.
Figure 13:
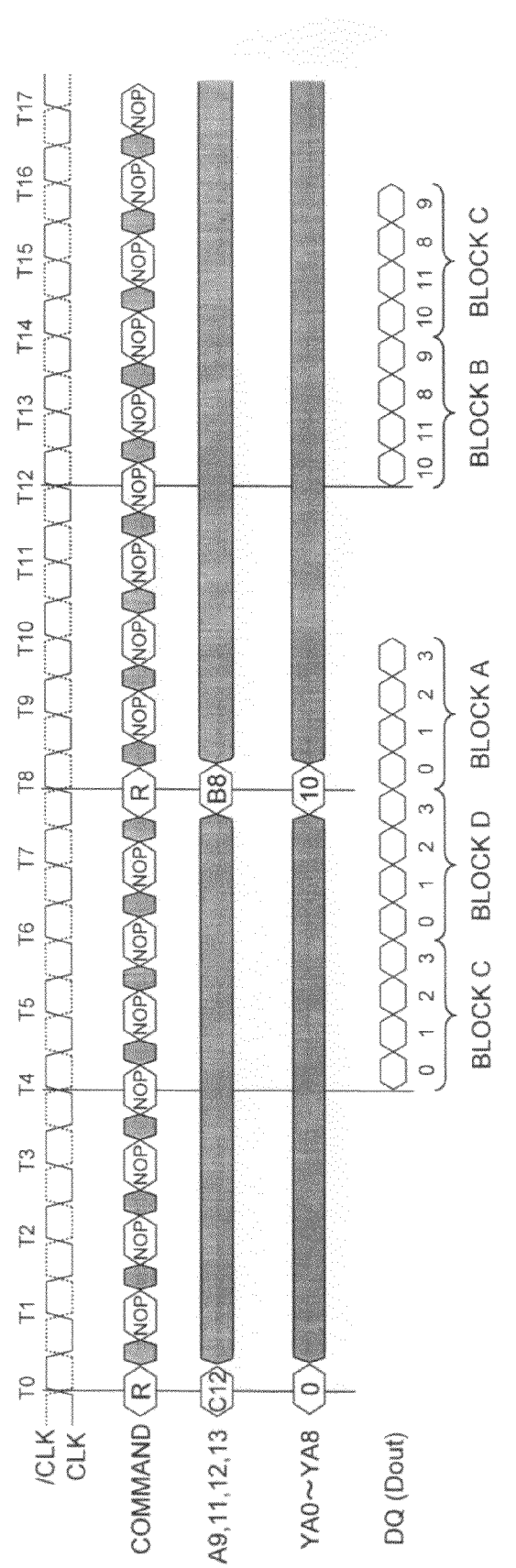
FIG. 13 is a timing chart showing an example of a read operation of the data processing system 10.
Figure 18:
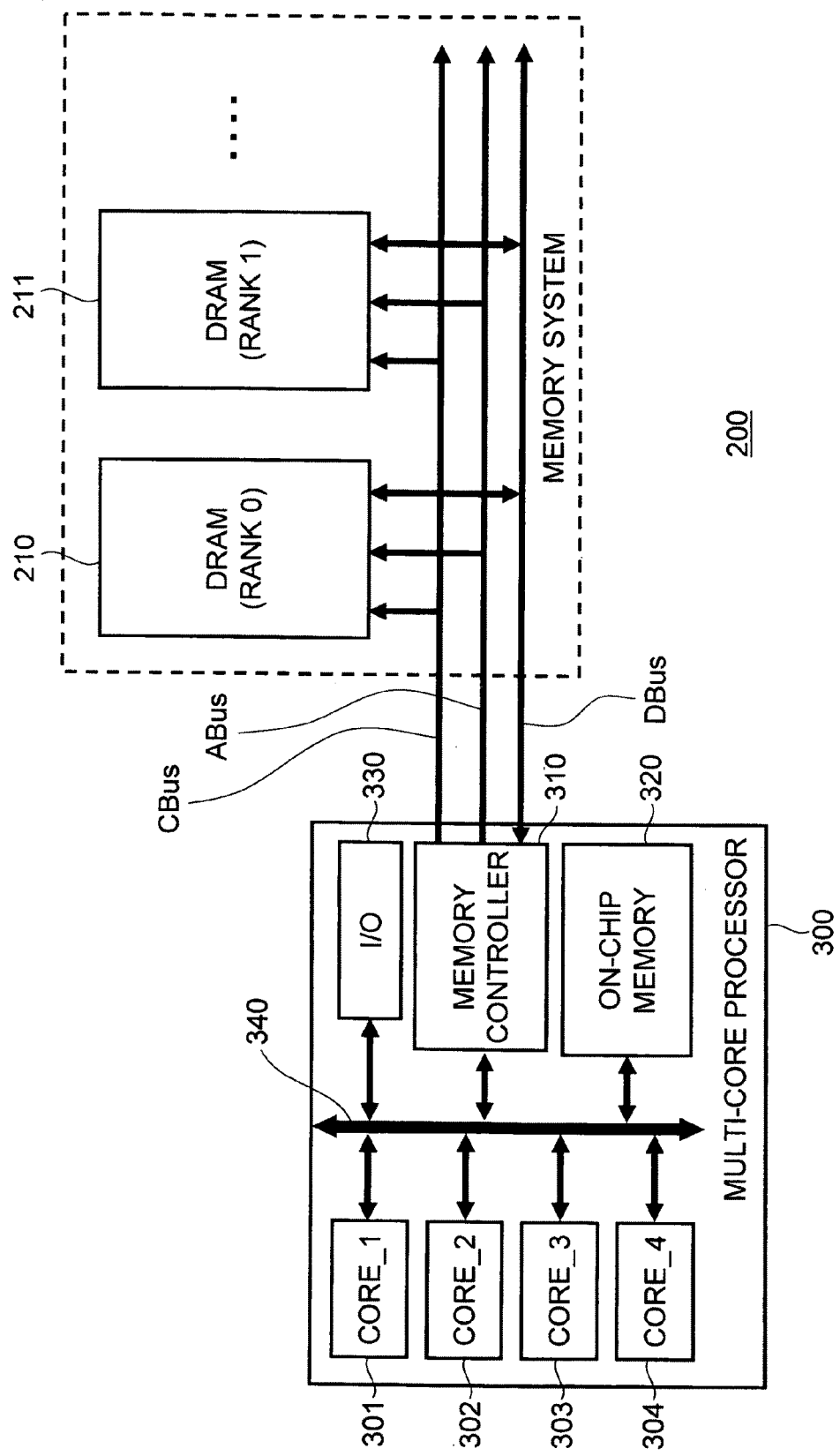
FIG. 18 is a block diagram showing an example in which the data processing system according to the present invention is applied by a plurality of DRAM chips.

A representative example of a technical concept for solving the problem of the present invention is described below. It is needless to mention that the contents that the present application is to claim for patent are not limited to the following technical concept, but to the description of the appended claims. That is, the technical concepts of the present invention are as follows. In a data processing system including a first semiconductor device (210) having a plurality of blocks (memory blocks A to D) each including a plurality of data and a second semiconductor device (300) having a first control circuit (310) that controls the first semiconductor device as shown in FIG. 18, the first control circuit issues a plurality of commands (R at T0 and R at T8) for communicating with the first semiconductor device in a plurality of access units (T0 and T8) including a plurality of first definitions (A12 and A13) that define a plurality of burst lengths each indicating the number of different data and a plurality of second definitions (A9 and A11) that define correspondences between certain elements of data among the plural data included in the blocks, respectively, and arrangement orders in the numbers of different data that constitute the burst lengths, respectively, as shown in FIG. 13. The first semiconductor device (210) and the first control circuit (310) communicate with the first semiconductor device through plural data in the number of different data according to the first and second definitions. As shown in FIG. 5, during a read mode, for example, the first semiconductor device (210) selects one memory block or two or more memory blocks from among plural memory blocks included in a back end 64 according to a specified burst length, rearranges plural read data that are read from the selected memory blocks in units of memory blocks through a read-data arranging circuit 65 included in the back end, and then burst-outputs the plural read data corresponding to the burst length in parallel through a circuit 67 with a parallel-serial converting function included in a front end. This makes an output order of the read data to be burst-outputted variable and therefore a variety of burst functions can be realized. A control method of a data processing system according to the present invention enables to read plural read data in parallel from at least one of the memory blocks each including plurality of memory cells and to output the plural read data in serial in an order of memory blocks specified by a start-block select signal by the number of bits specified by a burst select signal.

Preferred embodiments of the present invention will be explained below in detail with reference to the accompanying drawings.

Figure 1:
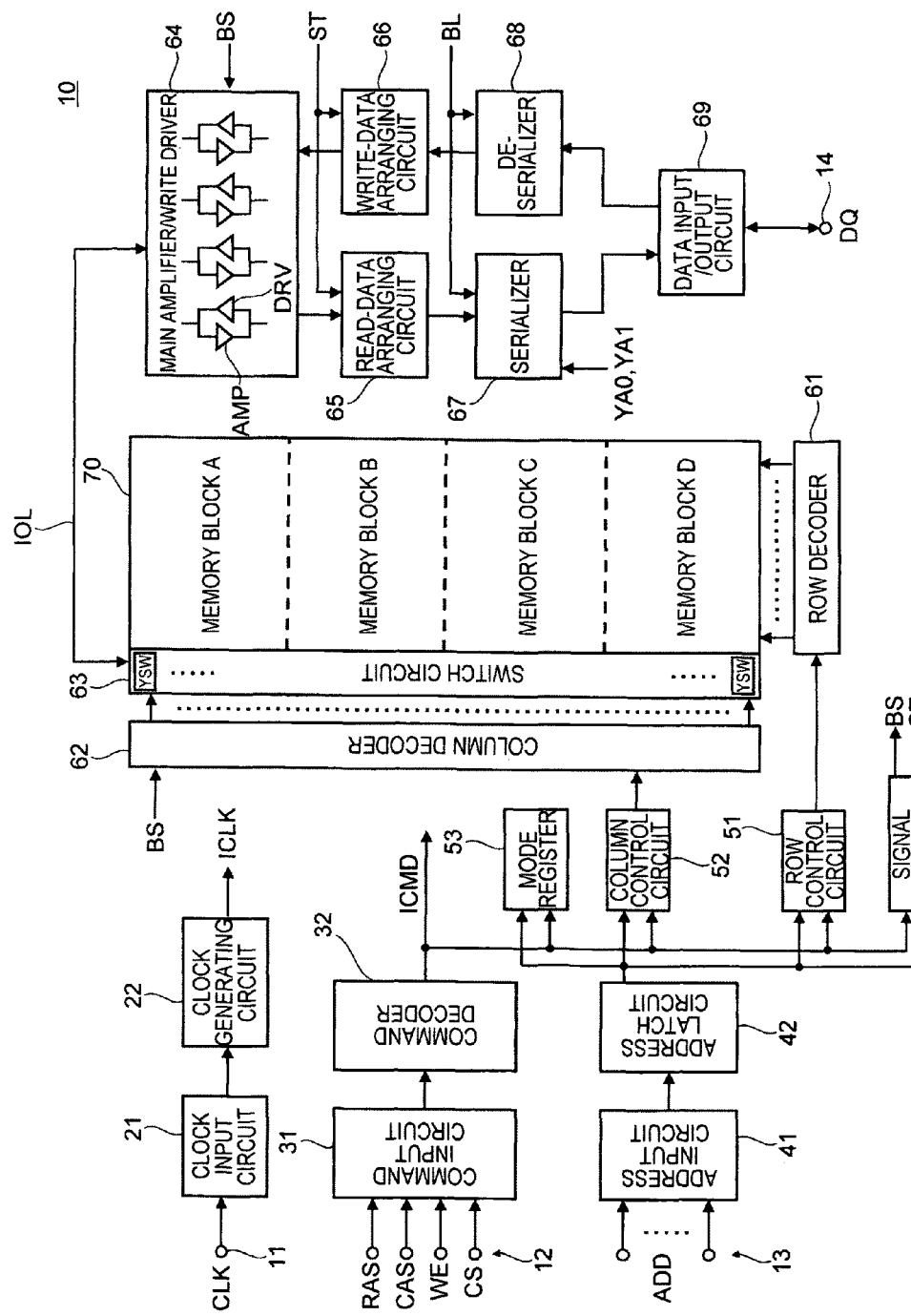
FIG. 1 is a block diagram showing a configuration of a data processing system 10 according to an embodiment of the present invention.

FIG. 1 is a block diagram showing a configuration of a data processing system 10 according to an embodiment of the present invention. The data processing system 10 according to the present embodiment is a DRAM, which is a volatile memory integrated on a single semiconductor chip.

As shown in FIG. 1, the data processing system 10 according to the present embodiment includes at least a clock terminal 11, a command terminal 12, an address terminal 13, and a data input/output terminal 14 (data terminal) as external terminals. Although a supply terminal, a data strobe terminal and the like are also included, these terminals are not shown. While only one data input/output terminal 14 is shown in FIG. 1 for sake of simplicity, the data processing system 10 according to the present embodiment includes eight data input/output terminals and can simultaneously input or output up to eight bits of data.

The clock terminal 11 is a terminal to which an external clock signal CLK is inputted, and the inputted external clock signal CLK is supplied to a clock input circuit 21. An output of the clock input circuit 21 is supplied to a clock generating circuit 22. The clock generating circuit 22 serves a function of generating an internal clock signal ICLK based on the external clock signal CLK and supplying the internal clock signal ICLK to various circuit blocks, which are explained later.

The command terminal 12 is a terminal to which command signals such as a row-address strobe signal RAS, a column-address strobe signal CAS, a write enable signal WE, and a chip select signal CS are supplied. These command signals are supplied to a command input circuit 31. The command signals supplied to the command input circuit 31 are supplied to a command decoder 32. The command decoder 32 performs storage, decoding, counting and the like of the command signals in synchronization with the internal clock signal ICLK, thereby generating various internal commands ICMD. The generated internal commands ICMD are supplied to a row control circuit 51, a column control circuit 52, a mode register 53, a signal generating circuit 54 and the like.

The address terminal 13 is a terminal to which an address signal ADD is supplied, and the supplied address signal ADD is supplied to an address input circuit 41. An output of the address input circuit 41 is supplied to an address latch circuit 42. The address latch circuit 42 latches the address signal ADD in synchronization with the internal clock signal ICLK. A row address (XA) to be inputted in synchronization with a row command among the address signal ADD latched by the address latch circuit 42 is supplied to the row control circuit 51, and a column address (YA) to be inputted in synchronization with a column command is supplied to the column control circuit 52, the signal generating circuit 54 and the like. When the system is entered in a mode register set, the address signal ADD is further supplied to the mode register 53. The mode register 53 is a register in which an operation mode of the data processing system 10 according to the present embodiment is set. For example, a latency or a clock frequency during a normal operation is defined by a mode signal that is set in the mode register 53. The mode signal set in the mode register 53 can cause the system to enter a test mode or the like. The signal generating circuit 54 generates a block select signal BS (which is composed of block select signals BSA to BSD), a start-block select signal ST (second control signal) (which is composed of start-block select signals STA to STD), and a burst-length select signal BL (first control signal) (which is composed of burst-length select signals BL4, BL8, BL12 and BL16) based on a burst-mode set signal (A9 and A11 to A13) which is inputted at the same time as the column address and supplied via an address signal line.

An output of the row control circuit 51 is supplied to a row decoder 61. The row decoder 61 is a circuit that selects one of word lines WL included in a memory cell array 70. As shown in FIG. 1, the memory cell array 70 is divided into four memory blocks A to D in the present embodiment. The memory cell array 70 has a plurality of memory cells MC that mainly store therein plural pieces of information. The memory cell MC is a volatile memory cell. These memory blocks A to D are distinguished from each other by the column address. An output of the column control circuit 52 is supplied to a column decoder 62. The column decoder 62 is a circuit that activates one of column switches YSW included in a switch circuit 63 based on the output of the column control circuit 52 and the block select signal BS.

The block select signal BS supplied to the column decoder 62 is a signal for selecting one of the memory blocks A to D as a target for a read operation or a write operation. Therefore, the switch circuit 63 outputs read data from the memory block selected by the block select signal BS to a main amplifier/write driver 64 via a data input/output line IOL, while not outputting read data from the memory blocks not selected by the block select signal BS to the main amplifier/write driver 64. The switch circuit 63 inputs write data to the memory block selected by the block select signal BS while not inputting write data to the memory blocks not selected by the block select signal BS. Accordingly, with respect to the memory blocks not selected by the block select signal BS, a refresh operation for storage information held in the memory cells MC, which are explained later, is simply performed during both of the read operation and the write operation.

The maim amplifier/write driver 64 serves a function of amplifying plural read data outputted in parallel from the memory cell array 70 via the data input/output line IOL to output the amplified data to a read-data arranging circuit 65 and also amplifying plural write data outputted in parallel from a write-data arranging circuit 66 to output the amplified data to the data input/output line IOL. As shown in FIG. 1, the main amplifier/write driver 64 has a plurality of amplifier circuits AMP and a plurality of driver circuits DRV corresponding to the memory blocks A to D, respectively, and activates at least one of the amplifier circuits AMP during a read operation while activating at least one of the driver circuits DRV during a write operation. The amplifier circuit AMP or the driver circuit DRV to be activated is specified by the block select signal BS. That is, during the read operation, the amplifier circuit AMP corresponding to the memory block selected by the block select signal BS is activated while the amplifier circuits AMP corresponding to the memory blocks not selected by the block select signal BS are inactivated. Similarly, during the write operation, the driver circuit DRV corresponding to the memory block selected by the block select signal BS is activated while the driver circuits DRV corresponding to the memory blocks not selected by the block select signal BS are inactivated. Because the amplifier circuit AMP or the driver circuit DRV that performs input or output of data is selectively activated in this way, power consumption by the amplifier circuits AMP or the driver circuits DRV that do not perform input or output of data can be reduced.

The read-data arranging circuit 65 (second arranging circuit) and a serializer 67 (second converting circuit) are placed in series between the main amplifier/write driver 64 and a data input/output circuit 69. The read-data arranging circuit 65 serves a function of rearranging plural read data outputted in parallel from the main amplifier/write driver 64 in units of memory blocks based on the start-block select signal ST. The read data rearranged in units of memory blocks by the read-data arranging circuit 65 are supplied to the serializer 67. The serializer 67 is a circuit that serially outputs the read data parallelly outputted from the read-data arranging circuit 65 by the number of bits specified by the burst-length select signal BL. An output order of read data that are read from a same block is specified by start-address select signals YA0 and YA1 (third portion), which are parts of the column address. The read data converted into serial data by the serializer 67 are outputted outside via the data input/output circuit 69 and the data input/output terminal 14.

A deserializer 68 (first converting circuit) and the write-data arranging circuit 66 (first arranging circuit) are placed in series between the data input/output circuit 69 and the main amplifier/write driver 64. Write data inputted from outside to the data input/output terminal 14 are supplied to the deserializer 68 via the data input/output circuit 69. The deserializer 68 serves a function of parallelly outputting plural write data that are serially inputted by the number of bits specified by the burst-length select signal BL. The write data converted into parallel data by the deserializer 68 are supplied to the write-data arranging circuit 66. The write-data arranging circuit 66 serves a function of rearranging the plural write data outputted in parallel from the deserializer 68 in units of memory blocks based on the start-block select signal ST. The write data rearranged in units of memory blocks by the write-data arranging circuit 66 are written to the memory cell array 70 via the main amplifier/write driver 64. Here, the start-address select signals YA0 and YA1 are not inputted to the write-data arranging circuit 66. This is because a start address during the write operation is fixed (it is fixed to YA0, YA1=0, 0, for example) and values of YA0 and YA1 practically inputted are ignored. When the start address during the write operation is not fixed, the start-address select signals YA0 and YA1 are inputted to the write-data arranging circuit 66.

The memory cell array 70, a circuit related thereto, the main amplifier/write driver 64, the read-data arranging circuit 65, and the write-data arranging circuit 66 are defined as a back end. The serializer 67, the deserializer 68, and the data input/output circuit 69 are defined as a front end having a higher operation frequency than that of the back end.

The overall configuration of the data processing system 10 is as described above.

Figure 2:
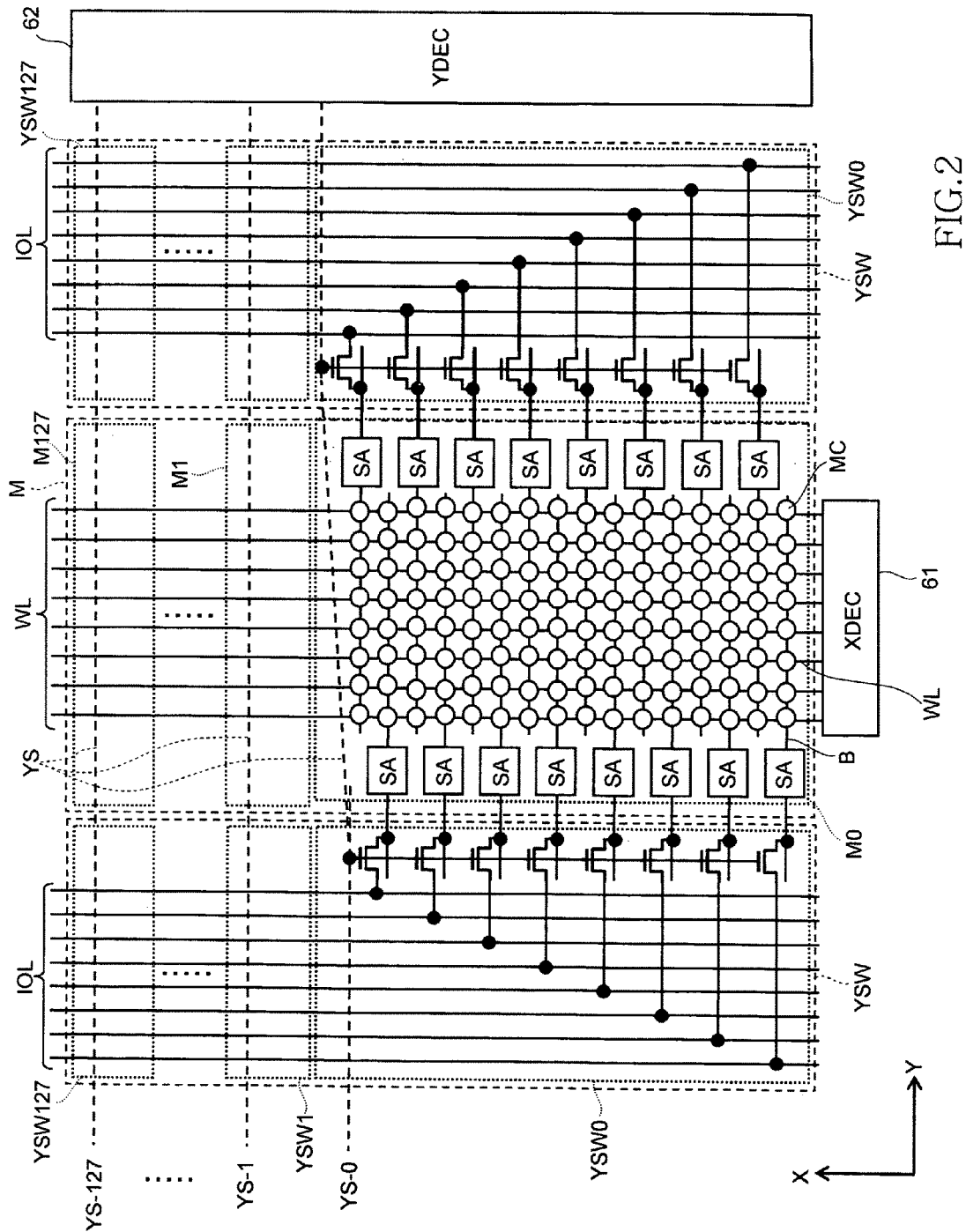
FIG. 2 is a circuit diagram showing an example of a half configuration of each memory block, and shows an example using single-ended bit lines.

FIG. 2 is a circuit diagram showing an example of a half configuration of each memory block, and shows an example using single-ended bit lines.

In the example shown in FIG. 2, a memory cell MC is placed at each of intersections between word lines WL and bit lines B in a memory cell area M. A sense amplifier SA is connected to each of the bit lines B. Because the data processing system according to the present embodiment is a DRAM, the read operation and the write operation are both performed by same sense amplifiers SA; however, this is not essential in the present invention. Therefore, sense amplifiers for reading and write drivers for writing can be separately provided.

Column switches YSW (which are composed of column switches YSW0 to YSW127) are placed on either side of the memory cell area M in a Y direction. For example, in response to activation of one column select line YS corresponding to the column switch YSW0, eight bit lines B are connected to eight data input/output lines IOL, respectively. That is, the column switch YSW includes 16 MOSFETs having gate electrodes to which the column select line YS is connected in common and, when these 16 MOSFETs are turned on, the 16 sense amplifiers SA are connected to corresponding 16 data input/output lines IOL, respectively. In this example, the bit lines B are alternately connected to the sense amplifiers SA on either side. This enables to arrange the sense amplifiers SA connected to every other bit line B in an X direction. The data input/output lines IOL can be replaced by input data wirings and output data wirings.

As shown in FIG. 2, 128 sets (groups) each including the memory cell area M (M0 to M127) including the 16 bit lines B that are simultaneously selected, and the column switches YSW (YSW0 to YSW127) placed on the both sides thereof are placed in the X direction, and one of the sets is selected by parts YA2 to YA8 of the column address. That is, one of 128 column select lines YS0 to YS127 is activated by the column decoder 62 and the corresponding one of the memory cell areas M0 to M127 is connected to the 16 data input/output lines IOL. Here, the circuit shown in FIG. 2 depicts a half area of one memory block and thus 32 bits of data are simultaneously inputted or outputted with respect to one memory block.

Figure 3:
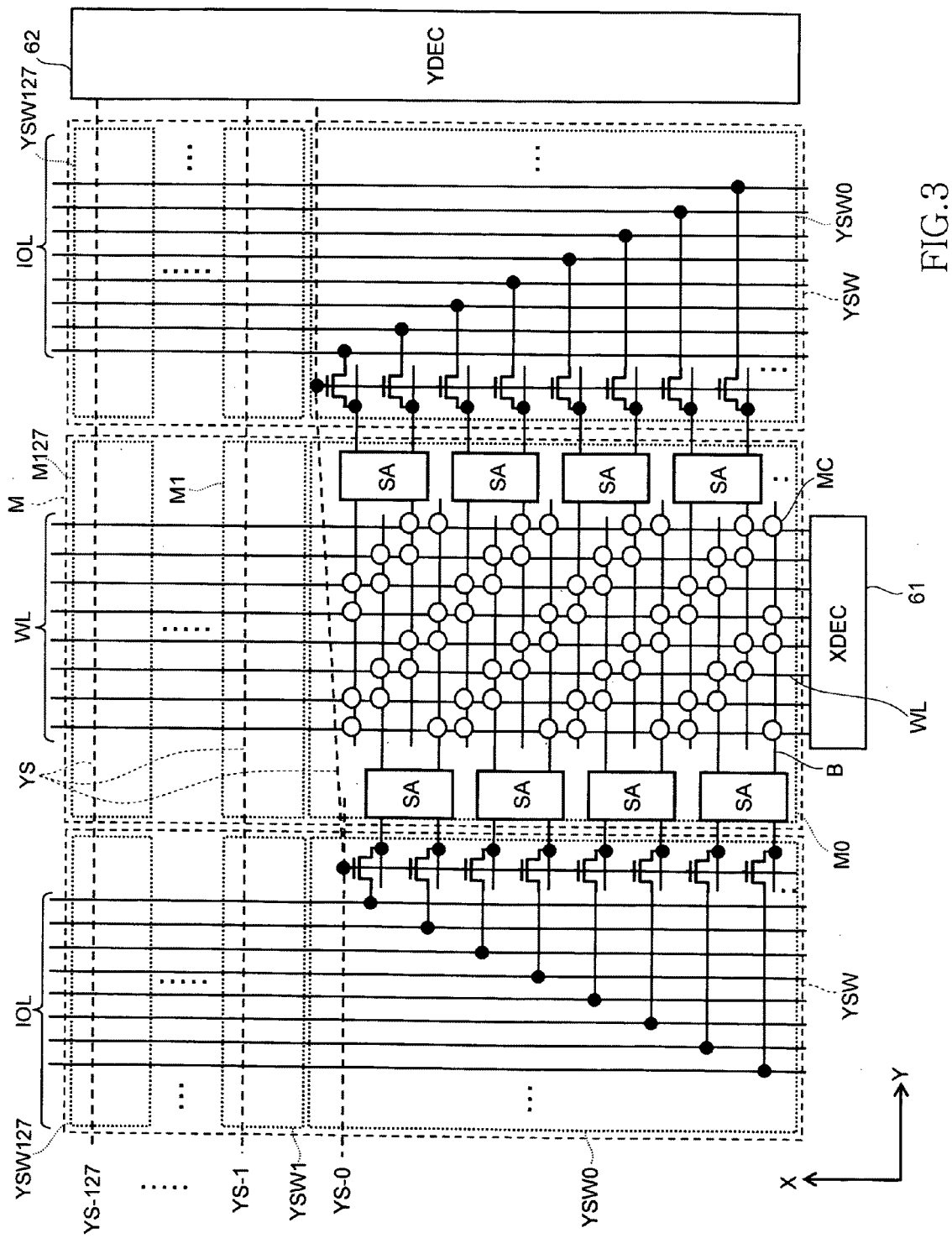
FIG. 3 is a circuit diagram of another example of a half configuration of each memory block, and shows an example using differential bit lines.

FIG. 3 is a circuit diagram of another example of a half configuration of each memory block, and shows an example using differential bit lines.

In the example shown in FIG. 3, memory cells MC are placed at predetermined intersections between word lines WL and bit lines B in a memory cell area M. A pair of bit lines B is connected to a sense amplifier SA. As described above, because the data processing system according to the present embodiment is a DRAM, the read operation and the write operation are both performed by same sense amplifiers SA; however, this is not essential in the present invention.

Plural column switches YSW (which are composed of column switches YSW0 to YSW127) are placed on either side of the memory cell area M in the Y direction. The column switch YSW serves a function of connecting eight pairs of bit lines B to eight pairs of data input/output lines IOL, respectively, in response to activation of one corresponding column select line YS. That is, through 32 MOSFETs having gate electrodes to which the column select line YS is connected in common, 16 sense amplifiers SA are connected to corresponding 16 pairs of data input/output lines IOL, respectively. As described above, the data input/output lines IOL can be replaced by input data wirings and output data wirings.

As shown in FIG. 3, 128 sets (groups) each including the memory cell area M (M0 to M127) each including 32 (16 pairs of) bit lines that are simultaneously selected and the column switches YSW (YSW0 to YSW127) placed on the both sides thereof are provided in the X direction, and one of the sets is selected by parts YA2 to YA8 of the column address. That is, one of the 128 column select lines YS0 to YS127 is activated by the column decoder 62 and then corresponding one of the memory cell areas M0 to M127 is connected to 16 pairs of data input/output lines IOL. The circuit shown in FIG. 3 depicts a half of one memory block and thus 32 bits of data are simultaneously inputted or outputted with respect to one memory block. This point is the same as in the circuit shown in FIG. 2.

Figure 4:
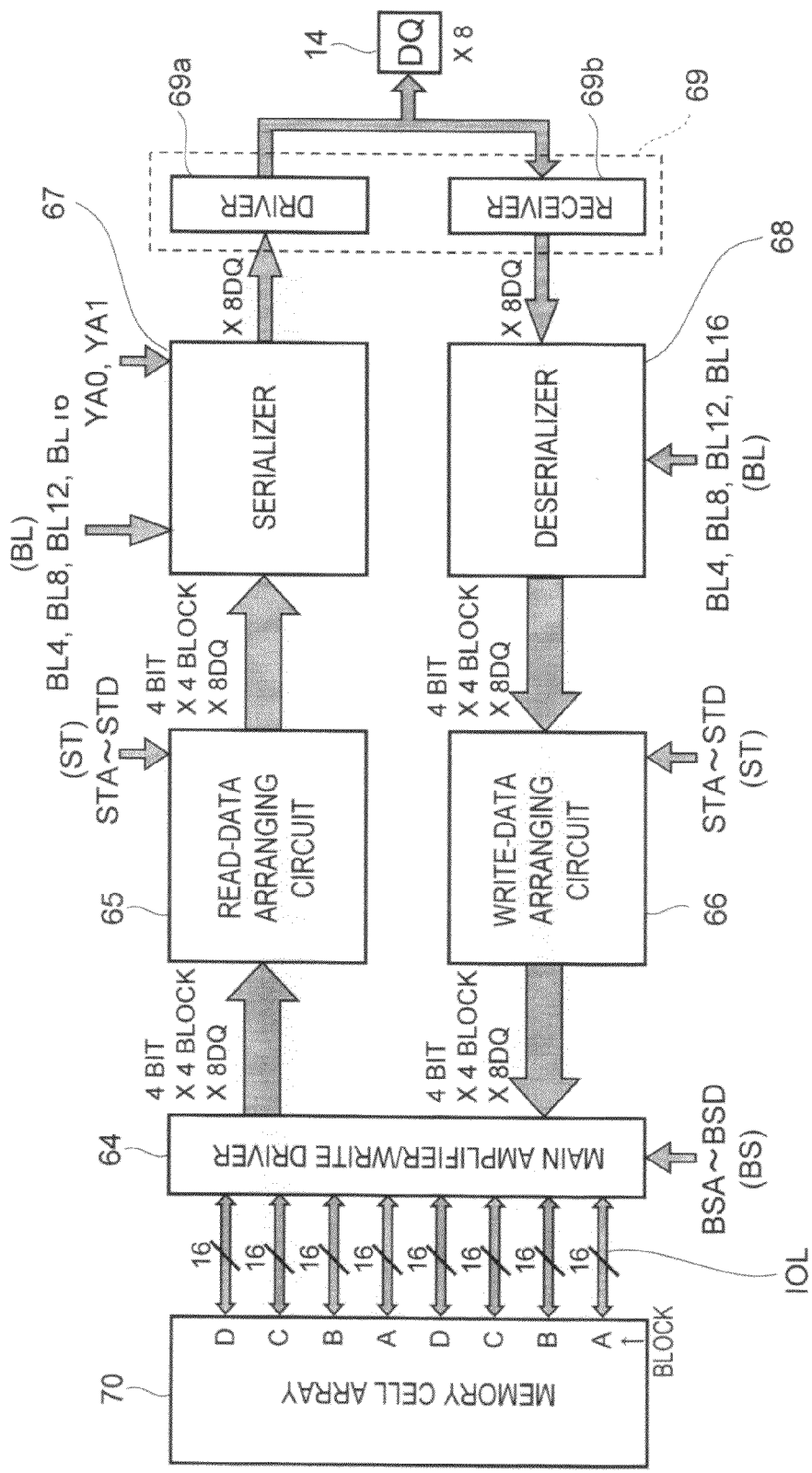
FIG. 4 is a block diagram showing extracted circuits that are provided between a memory cell array 70 and a data input/output terminal 14.

FIG. 4 is a block diagram showing extracted circuits that are provided between the memory cell array 70 and the data input/output terminal 14.

As shown in FIG. 4, the data input/output line IOL that connects the memory cell array 70 and the main amplifier/write driver 64 has a bit width of 16 bits×2 (=32 bits) with respect to each memory block. This indicates that, when all of the four memory blocks A to D are to be accessed, data of a 128-bit width in total are simultaneously inputted or outputted. Selection is performed by a row address XA0 to XA13 of a 14-bit width and a column address YA2 to YA8 of a 7-bit width. That is, the row address XA0 to XA13 of a 14-bit width is supplied to the row decoder 61 shown in FIG. 1, which selects one of 16384 word lines WL. The memory cells MC connected to the selected word line WL are connected to the bit lines B in the memory cell array 70 and sense amplification of read data or writing of data is performed via one of the sense amplifiers SA connected to the bit lines B. Selection of the sense amplifier SA is performed by the column decoder 62 that receives the column address YA2 to YA8 and the block select signal BS, and accordingly 32 bits of read data or write data are inputted or outputted in parallel to or from the selected memory block.

The block select signal BS is composed of block select signals BSA to BSD of four bits for selecting the corresponding memory blocks A to D, respectively. For example, when the block select signal BSA is active and the block select signals BSB to BSD are inactive, only the column switches YSW corresponding to the memory block A are activated and therefore a data width simultaneously inputted or outputted between the memory cell array 70 and the main amplifier/write driver 64 becomes 32 bits. When the block select signals BSA and BSB are active and the block select signals BSC and BSD are inactive, only the column switches YSW corresponding to the memory blocks A and B are activated and therefore a data width simultaneously inputted or outputted between the memory cell array 70 and the main amplifier/write driver 64 becomes 64 bits. Further, when the block select signals BSA to BSC are active and the block select signal BSD is inactive, only the column switches YSW corresponding to the memory blocks A to C are activated and therefore a data width simultaneously inputted or outputted between the memory cell array 70 and the main amplifier/write driver 64 becomes 96 bits. When the block select signals BSA to BSD are all active, 128 bits of data are simultaneously inputted or outputted as described above.

As shown in FIG. 4, these block select signals BSA to BSD are supplied also to the main amplifier/write driver 64. The main amplifier/write driver 64 receives the block select signals BSA to BSD and selectively activates the corresponding amplifier circuits AMP or driver circuits DRV. Accordingly, only read data that are read from the selected memory blocks A to D are supplied to the read-data arranging circuit 65 during the read operation and only write data to be written to the selected memory blocks A to D are supplied to the memory cell array 70 during the write operation.

Up to 128-bit data to be inputted or outputted in parallel between the main amplifier/write driver 64 and the read-data arranging circuit 65 or the write-data arranging circuit 66 are assigned to the eight data input/output terminals 14 by 16 bits. The 16-bit data to be assigned to one data input/output terminal 14 are assigned to the memory blocks A to D by four bits. FIG. 5 schematically shows a portion of the system related to the 16-bit data to be assigned to one data input/output terminal 14. As shown in FIG. 5, 4-bit registers Reg are grouped and assigned to each of the memory blocks A to D in the main amplifier/write driver 64, and the 16-bit data are assigned to one data input/output terminal 14.

In FIG. 4, the read-data arranging circuit 65 is a circuit that rearranges the read data that are outputted in parallel from the main amplifier/write driver 64 in units of memory blocks based on the start-block select signal ST. The start-block select signal ST is composed of start-block select signals STA to STD (plural second control signals) of four bits for selecting the corresponding memory blocks A to D, respectively. The start-block select signals STA to STD are signals only one bit of which is activated. During the read operation, read data from one of the memory blocks A to D corresponding to the activated one of the start-block select signals STA to STD are first outputted from the data input/output terminal 14. Therefore, "start" indicates a memory block in which the read data first outputted from the data input/output terminal 14 are stored.

In FIG. 4, the write-data arranging circuit 66 is a circuit that rearranges the write data outputted in parallel from the deserializer 68 in units of memory blocks based on the start-block select signal ST. Accordingly, write data inputted first from the data input/output terminal 14 are written to one of the memory blocks A to D corresponding to the activated one of the start-block select signals STA to STD during the write operation. Therefore, "start" indicates a memory block in which the write data inputted first from the data input/output terminal 14 are stored.

Respective functions of the read-data arranging circuit 65 and the write-data arranging circuit 66 are shown in FIG. 5 as the schematic diagram. As described above, FIG. 5 schematically shows the portion of the system related to the 16-bit data assigned to one of the data input/output terminals 14.

Figure 6:
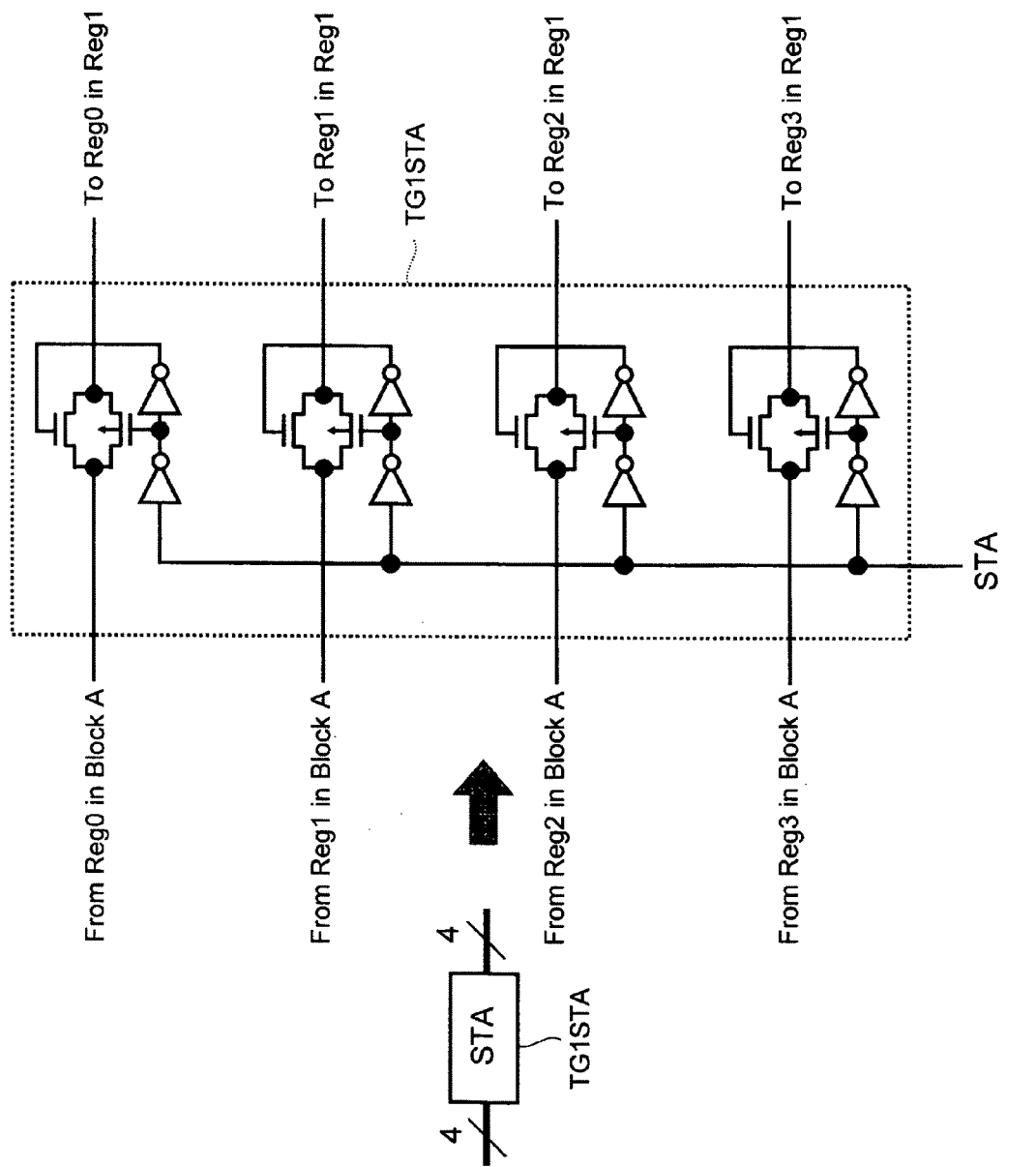
FIG. 6 is a circuit diagram of a circuit TG1STA included in a switching circuit TG1.

A connection relation of the read-data arranging circuit 65 is explained, for example. Grouped switching circuits TG (TG1 to TG4) each having a plurality of switch circuits are used. The switch circuits are controlled correspondingly by the start-block select signals STA to STD, one of which is activated. Four registers Reg0 to Reg3 included in the block A within the main amplifier/write driver 64 each have one data input/output node on a side of the read-data arranging circuit 65. The same holds for respective four registers Reg0 to Reg3 of the blocks B to D. The read-data arranging circuit 65 has the four switching circuits TG1 to TG4 each having four switch circuits (TG1STA, TG1STB, TG1STC, and TG1STD: Here, TG1STA denotes a switch circuit that belongs to the switching circuit TG1 and is controlled by the start-block select signal STA, for example. The same holds for other reference characters.), which are controlled by the start-block select signals STA to STD, respectively. One switch circuit TG1STA has four first input/output nodes on a side of the blocks and four second input/output nodes on a side of the serializer 67. The four first input/output nodes of the switch circuit TG1STA are connected to corresponding four input/output nodes of the four registers Reg0 to Reg3 of one of the blocks in the main amplifier/write driver 64, respectively. Four outputs of the four registers Reg0 to Reg3 of the block A are connected in parallel to the four switch circuits (TG1STA, TG2STD, TG3STC, and TG4STB) which are included in the four switching circuits TG1 to TG4 and controlled by the different start-block select signals STA to STD, respectively. Four second input/output nodes of the switch circuit TG1SAT are connected to corresponding four input/output nodes of four registers 0 to 3 included in one of the registers of the serializer 67, respectively. Ones of the respective four second input/output nodes of the four switch circuits (TG1STA, TG1STB, TG1STC, and TG1STD) included in the switching circuit TG1 are wired OR, respectively. The wired-ORed second input/output node is connected to one of the four registers 0 to 3 included in one of the registers of the serializer 67. The same holds for the write-data arranging circuit 66. The switch circuit TG1STA has four segment switch circuits corresponding to the four first input/output nodes and the four second input/output nodes, respectively, as shown in FIG. 6.

A function of the read-data arranging circuit 65 is explained. For example, when the start-block select signal STA is active, the memory blocks A to D are assigned to the switching circuits TG1 to TG4, respectively. Specifically, with respect to the switching circuit TG1, a switch circuit corresponding to the start-block select signal STA is selected (activated) from among the four switch circuits corresponding to the start-block select signals STA to STD, respectively, in the switching circuit TG1, and the four registers Reg0 to Reg3 corresponding to the block A among the four blocks A to D in the main amplifier/write driver 64 are assigned thereto. Meanwhile, the switch circuit corresponding to the start-block select signal STA among the four switch circuits corresponding to the start-block select signals STA to STD, respectively, in the switching circuit TG1 is selected (activated), and the four registers 0 to 3 corresponding to the register Reg1 among the grouped four registers Reg1 to Reg4 in the serializer 67 are assigned thereto. Accordingly, the selected switch circuit in the switching circuit TG1 communicates (electrically conducts) four parallel data of the back end (on the side of the memory cell array 70) and four serial data of the front end (on the side of the data input/output circuit 69). A similar action is performed in the write-data arranging circuit 66.

With respect to the switching circuit TG2, a switch circuit corresponding to the start-block select signal STA among the four switch circuits corresponding to the start-block select signals STA to STD, respectively, in the switching circuit TG2 is selected (activated), and the four registers Reg0 to Reg3 corresponding to the block B among the four blocks A to D in the main amplifier/write driver 64 are assigned thereto. Meanwhile, the switch circuit corresponding to the start-block select signal STA among the four switch circuits corresponding to the start-block select signals STA to STD, respectively, in the switching circuit TG2 is selected (activated), and the four registers 0 to 3 corresponding to the register Reg2 among the four registers Reg1 to Reg4 in the serializer 67 are assigned thereto. Accordingly, the selected switch circuit in the switching circuit TG2 communicates (electrically conducts) four parallel data of the back end (on the side of the memory cell array 70) and four serial data of the front end (on the side of the data input/output circuit 69). Similar actions are performed in the switching circuits TG3 and TG4. Furthermore, a similar action is performed in the write-data arranging circuit 66.

When the start-block select signal STB is active, the memory blocks B, C, D, and A are assigned to the grouped switching circuits TG1 to TG4, respectively. Specific switching is performed in the same manner as in the explanation of the communication of one switch circuit among the respective four switch circuits of the switching circuits TG1 to TG4 as described above. When the start-block select signals STC is active, the memory blocks C, D, A, and B are assigned to the switching circuits TG1 to TG4, respectively. When the start-block select signals STD is active, the memory blocks D, A, B, and C are assigned to the switching circuits TG1 to TG4, respectively. A circuit diagram of the circuit TG1STA included in the switching circuit TG1 is shown in FIG. 6. The circuit TG1STA includes four transfer gates (segment switch circuits) that are conducted by the start-block select signal STA. Therefore, it can be understood that the grouped switching circuits TG1 to TG4 are divided into a plurality of groups corresponding to the number of combinations of arrangement orders.

The read data that are rearranged by the read-data arranging circuit 65 are supplied in parallel to the serializer 67. The serializer 67 is supplied with the burst-length select signal BL and performs parallel-serial conversion of data of the number of bits specified by the burst-length select signal BL with respect to each of the data input/output terminals 14. The plural data that have been parallel-serial converted are outputted to the data input/output terminals 14. The burst-length select signal BL is composed of four burst-length select signals BL4, BL8, BL12, and BL16 (plurality of first control signals) and one of the signals is activated.

The write-data arranging circuit 66 is a circuit that performs an input/output operation opposite to that of the read-data arranging circuit 65 as described above. The write data rearranged by the write-data arranging circuit 66 are supplied in parallel to the 4-bit registers Reg grouped for each of the memory blocks A to D. The deserializer 68 is supplied with the burst-length select signal BL and performs serial-parallel conversion of data by the number of bits specified by the burst-length select signal BL with respect to each of the data input/output terminals 14. The plural data that have been serial-parallel converted are outputted to the write-data arranging circuit 66. The burst-length select signal BL is composed of the four burst-length select signals BL4, BL8, BL12, and BL16 and one of the signals is activated.

The burst-length select signal BL4 is a signal activated when a burst length is set to four bits. Explanations are given for the serializer 67. When the burst-length select signal BL4 is active, only 4-bit read data latched in the register Reg1 in the serializer 67 corresponding to the switching circuit TG1 are serially outputted to the data input/output terminals 14. The burst-length select signal BL8 is a signal activated when a burst length is set to eight bits. When the signal BL8 is active, 8-bit read data latched in the registers Reg1 and Reg2 in the serializer 67 corresponding to the switching circuits TG1 and TG2, respectively, are serially outputted in this order. The burst-length select signal BL12 is a signal activated when a burst length is set to 12 bits. When the signal BL12 is active, 12-bit read data latched in the registers Reg1 to Reg3 in the serializer 67 corresponding to the switching circuits TG1 to TG3, respectively, are serially outputted in this order. The burst-length select signal BL16 is a signal activated when a burst length is set to 16 bits. When the signal BL16 is active, 16-bit read data latched in the registers Reg1 to Reg4 in the serializer 67 corresponding to the switching circuits TG1 to TG4, respectively, are serially outputted in this order.

Explanations are given for the deserializer 68. When the burst-length select signal BL4 is active, only 4-bit write data latched in the register Reg1 in the deserializer 68 corresponding to the switching circuit TG1 are parallelly outputted to the write-data arranging circuit 66. The burst-length select signal BL8 is a signal activated when a burst length is set to eight bits and, when the signal BL8 is active, 8-bit write data latched in the registers Reg1 and Reg2 in the deserializer 68 corresponding to the switching circuits TG1 and TG2, respectively, are parallelly outputted in this order. The burst-length select signal BL12 is a signal activated when a burst length is set to 12 bits. When the signal BL12 is active, 12-bit write data latched in the registers Reg1 to Reg3 in the deserializer 68 corresponding to the switching circuits TG1 to TG3, respectively, are parallelly outputted in this order. The burst-length select signal BL16 is a signal activated when a burst length is set to 16 bits. When the signal BL16 is active, 16-bit write data latched in the registers Reg1 to Reg4 in the deserializer 68 corresponding to the switching circuits TG1 to TG4, respectively, are parallelly outputted in this order.

An order in which the 4-bit read data latched in the registers Reg1 to Reg4, respectively, that is, 4-bit read data that are read from the same memory blocks A to D are to be outputted is specified by the start-address select signals YA0 and YA1 as parts of the column address.

The output of the serializer 67 is supplied to a driver 69a included in the data input/output circuit 69 and outputted by the driver 69a to outside through the data input/output terminals 14.

The deserializer 68 is a circuit that performs an operation opposite to that of the serializer 67 described above. That is, the deserializer 68 latches the write data serially inputted from the data input/output terminals 14 through a receiver 69b into the grouped registers Reg1 to Reg4 based on the burst-length select signal BL during the write operation.

That is, a function of the read-data arranging circuit 65 is to transmit plural read data up to 16 bits read by the main amplifier/write driver 64 as the back end to the 16 registers Reg included in the serializer 67 as the front end by using the 16 segment switch circuits selected from among the 64 segment switch circuits under control of the start-block select signals STA to STD, respectively.

A function of the write-data arranging circuit 66 is to transmit plural write data up to 16 bits latched from outside by the deserializer 68 as the front end to the 16 registers Reg included in the main amplifier/write driver 64 as the back end by using the 16 segment switch circuits selected from among the 64 segment switch circuits under control of the start-block select signals STA to STD, respectively.

Figure 7D:
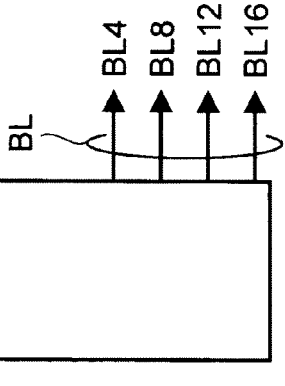
FIG. 7D is a diagram showing a mode register.
Figure 7A:
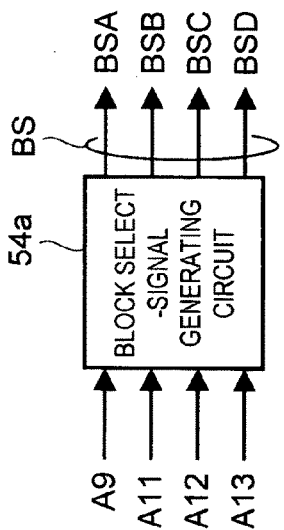
FIGS. 7A to 7C are diagrams showing a block select-signal generating circuit, a start-block select-signal generating circuit, and a burst-length select-signal generating circuit, respectively.
Figure 7B:
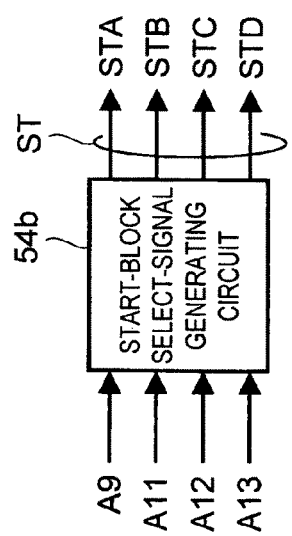
Figure 7C:
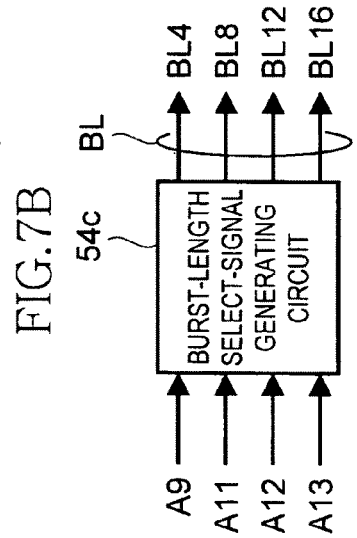

FIGS. 7A to 7C are diagrams showing a block select-signal generating circuit 54a, a start-block select-signal generating circuit 54b, and a burst-length select-signal generating circuit 54c, respectively.

The block select-signal generating circuit 54a, the start-block select-signal generating circuit 54b, and the burst-length select-signal generating circuit 54c are included in the signal generating circuit 54 shown in FIG. 1, and the burst-mode set signals A9 and A11 to A13 that are inputted at the same time as the column address and supplied through the address signal line are inputted to all these circuits. That is, while the burst-mode set signals A9 and A11 to A13 are not used as the column address to be supplied to the column decoder 62, these signals A9 and A11 to A13 are inputted through the address terminals 13 at the same time as the column address YA0 to YA8. Seen in that light, the burst-mode set signals A9 and A11 to A13 can be considered as a part of an address signal. The block select-signal generating circuit 54a activates one to four bits of the block select signals BSA to BSD based on the burst-mode set signals A9 and A11 to A13. The start-block select-signal generating circuit 54b activates any one of the start-block select signals STA to STD based on the burst-mode set signals A9 and A11 to A13. The burst-length select-signal generating circuit 54c activates any one of bits of the burst-length select signals BL4, BL8, BL12, and BL16 based on the burst-mode set signals A9 and A11 to A13. A truth table showing relations between the burst-mode set signals A9 and A11 to A13, the block select signals BSA to BSD, the start-block select signals STA to STD, and the burst-length select signals BL4, BL8, BL12, and BL16 is shown in FIG. 8. According to the truth table shown in FIG. 8, the start-block select-signal generating circuit 54b generates one of the start-block select signals STA to STD based on only two bits (a first portion: a second definition) of the burst-mode set signals A9 and A11. The burst-length select-signal generating circuit 54c generates one of the burst-length select signals BL4, BL8, BL12, and BL16 based on only two bits (a second portion: a first definition) of the burst-mode set signals A12 and A13. The block select-signal generating circuit 54a independently activates one to four bits of the block select signals BSA to BSD based on only four bits (the first and second portions) of the burst-mode set signals A9 and A11 to A13. In the present embodiment, there are 13 different combinations.

However, in the present invention, it is not essential to dynamically generate the block select signals BSA to BSD, the start-block select signals SAT to STD, and the burst-length select signals BL4, BL8, BL12, and BL16 based on the burst-mode set signals A9 and A11 to A13. These signals can be generated based on set values in the mode register 53 as shown in FIG. 7D. In this case, although the values of these signals cannot be dynamically changed for each access, the need to input the burst-mode set signals A9 and A11 to A13 for each access can be eliminated.

Figure 9:
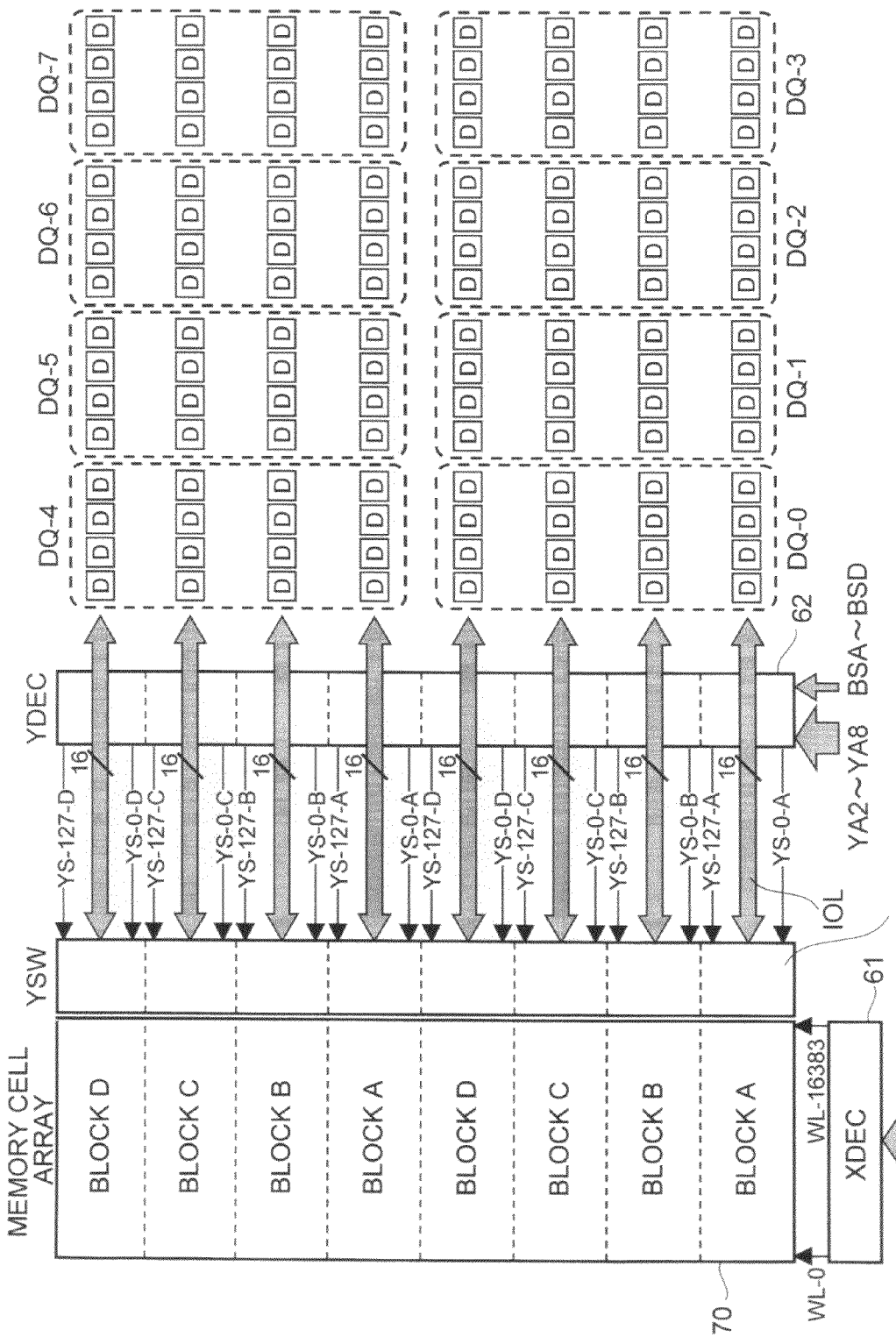
FIG. 9 is a schematic diagram for explaining an operation performed when a burst length is set to 16 bits.

FIG. 9 is a schematic diagram for explaining an operation performed when a burst length is set to 16 bits.

When the burst length is set to 16 bits, the block select signals BSA to BSD are all activated and all of the memory blocks A to D become targets to be accessed. For example, during the read operation, 32-bit read data that are read from the memory blocks A to D, respectively, are assigned to the eight data input/output terminals 14 by four bits, respectively. In the example shown in FIG. 9, each of the memory blocks A to D is physically divided into two. Ones of the divided blocks are assigned to four data input/output terminals 14 (DQ-0 to DQ-3) and the others of the divided blocks are assigned to the remaining four data input/output terminals 14 (DQ-4 to DQ-7). In other words, 16 bits are inputted or outputted to or from one of the divided memory blocks. These 16 bits are assigned to the four data input/output terminals 14 by four bits. In this way, the 16-bit read data outputted to each of the data input/output terminals 14 are burst-outputted in an order specified by the start-block select signal ST and the start-address select signals YA0 and YA1. The write operation is performed in an opposite manner.

As described above, when the burst length is set to 16 bits, because the block select signals BSA to BSD are all activated, the amplifier circuits AMP in the main amplifier/write driver 64 are all activated during the read operation and the driver circuits DRV in the main amplifier/write driver 64 are all activated during the write operation. The column switches YSW corresponding to the memory blocks A to D are activated based on the column address YA2 to YA8.

Figure 10:
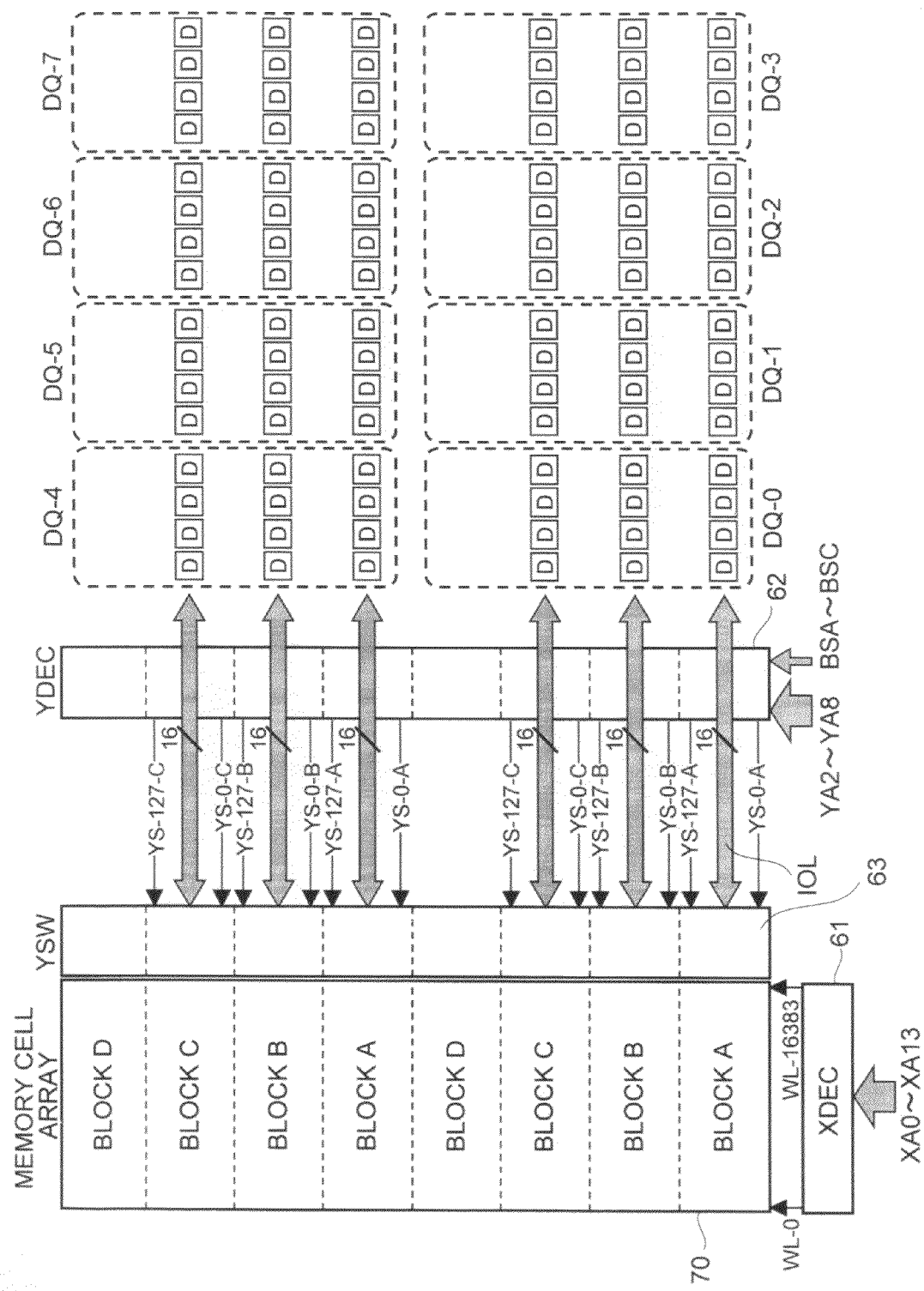
FIG. 10 is a schematic diagram for explaining an operation performed when a burst length is set to 12 bits.

FIG. 10 is a schematic diagram for explaining an operation performed when a burst length is set to 12 bits.

When the burst length is set to 12 bits, three bits of the block select signals BSA to BSD are activated and the corresponding three memory blocks among the memory blocks A to D become targets to be accessed. An example shown in FIG. 10 exemplifies a case where the memory blocks A to C are access targets and the memory block D is not an access target. That is, the block select signals BSA to BSC are activated. In this case, during the read operation, 32-bit read data that are read from the memory blocks A to C are assigned to the eight data input/output terminals 14 by four bits, respectively. In this way, 12-bit read data outputted to the data input/output terminals 14 are burst-outputted in an order specified by the start-block select signal ST and the start-address select signals YA0 and YA1. The write operation is performed in an opposite manner.

Figure 11:
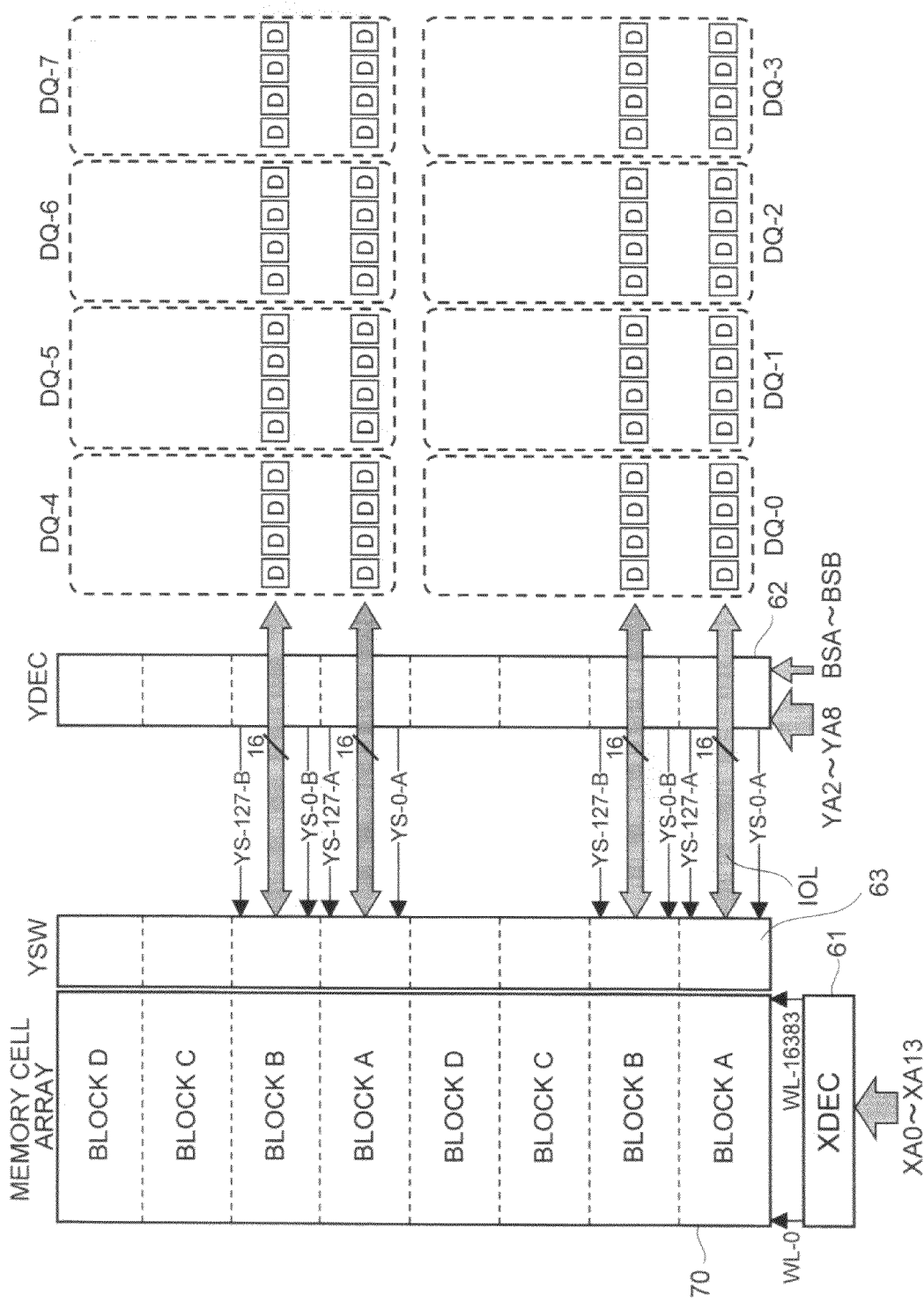
FIG. 11 is a schematic diagram for explaining an operation performed when a burst length is set to 8 bits.

FIG. 11 is a schematic diagram for explaining an operation performed when a burst length is set to eight bits.

When the burst length is set to eight bits, two bits of the block select signals BSA to BSD are activated and corresponding two of the memory blocks A to D become targets to be accessed. An example shown in FIG. 11 exemplifies a case where the memory blocks A and B are access targets and the memory blocks C and D are not access targets. That is, the block select signals BSA and BSB are activated. In this case, during the read operation, 32-bit read data that are read from the memory blocks A and B are assigned to the eight input/output terminals 14 by four bits, respectively. In this way, 8-bit read data outputted to each of the data input/output terminals 14 are burst-outputted in an order specified by the start-block select signal ST and the start-address select signals YA0 and YA1. The write operation is performed in an opposite manner.

Figure 12:
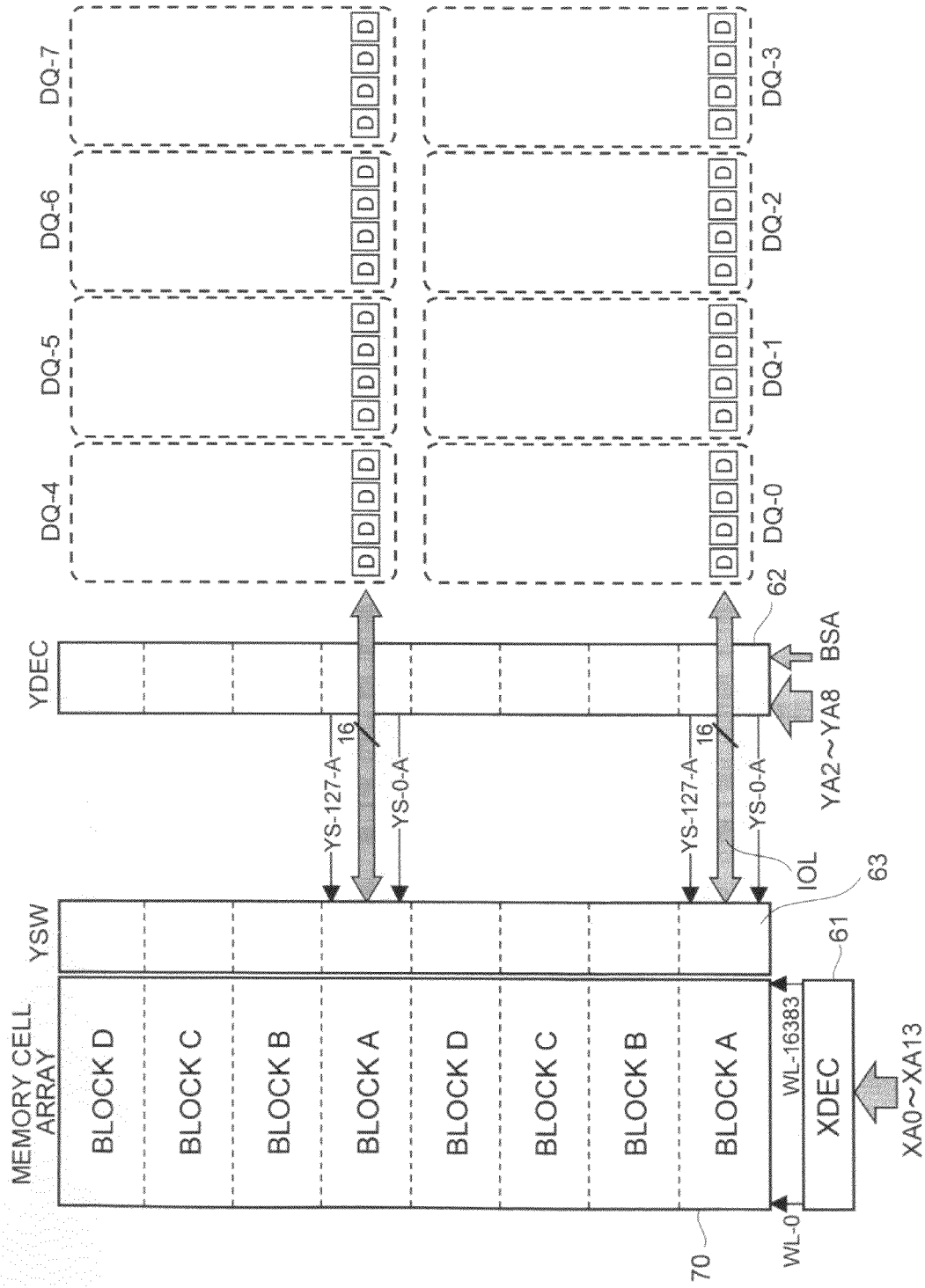
FIG. 12 is a schematic diagram for explaining an operation performed when a burst length is set to 4 bits.

FIG. 12 is a schematic diagram for explaining an operation performed when a burst length is set to four bits.

When the burst length is set to four bits, one bit among the block select signals BSA to BSD is activated and corresponding one of the memory blocks A to D becomes a target to be accessed. An example shown in FIG. 12 exemplifies a case where the memory block A is an access target and the memory blocks B to D are not access targets. That is, only the block select signal BSA is activated. In this case, during the read operation, 32-bit read data that are read from the memory block A are assigned to the eight data input/output terminals 14 by four bits, respectively. In this way, 4-bit read data outputted to each of the data input/output terminals 14 are burst-outputted in an order specified by the start-address select signals YA0 and YA1. The write operation is performed in an opposite manner.

As described above, when the burst length is set to 12, 8, or 4 bits, only part of the block select signals BSA to BSD is activated and accordingly the amplifier circuit AMP corresponding to the memory block that is not the access target (the memory block D in the example shown in FIG. 10) among the amplifier circuits AMP in the main amplifier/write driver 64 is inactivated during the read operation. Further, the driver circuit DRV corresponding to the memory block that is not the access target among the driver circuits DRV in the main amplifier/write driver 64 is inactivated during the write operation. Therefore, power consumption by the amplifier circuit AMP or the driver circuit DRV that does not contribute to the access can be reduced. In addition, the column switch YSW for the memory block that is not the access target is inactivated, and accordingly a charging/discharging current of the data input/output line IOL that is not used during the read operation can be reduced and destruction of data can be prevented during the write operation.

Furthermore, when the burst length is set to 16, 12, or 8 bits, the read data can be burst-outputted in an arbitrary order specified by the start-block select signal ST and the start-address select signals YA0 and YA1 during the read operation and the write data can be burst-inputted in an arbitrary order specified by the start-block select signal ST during the write operation. As described above, the data processing system 10 according to the present embodiment can not only vary the burst length but also specify an input or output order of data each time, thereby realizing a variety of burst operations.

FIG. 13 is a timing chart showing an example of the read operation of the data processing system 10 according to the present embodiment.

In the example shown in FIG. 13, read commands R are issued at a time T0 and a time T8. It indicates that the times T0 and T8 are access units in which the first control circuit (310) controls the first semiconductor device. The read command R is one of plural commands for communicating with the first semiconductor device. When the read command R is issued at the time T0, the burst-mode set signals A9 and A11 to A13 inputted at the same time have values that activate the block select signals BSA, BSC, and BSD, activate the start-block select signal STC, and activate the burst-length select signal BL12 (which is denoted as "C12" in FIG. 13). A value of the column address YA0 to YA8 inputted at the time T0 is "0".

In this case, output of read data is started at the time T4 when a predetermined latency (four clocks in the example shown in FIG. 13) has passed from issuance of the read command R. Read data corresponding to column addresses 0 to 3 of the memory block C are first outputted, read data corresponding to column addresses 0 to 3 of the memory block D are then outputted, and read data corresponding to column addresses 0 to 3 of the memory block A are finally outputted. In this way, burst output of 12 bits is completed.

Furthermore, in the example shown in FIG. 13, when the read command R is issued at the time T8, the burst-mode set signals A9 and A11 to A13 inputted at the same time have values that activate the block select signals BSB and BSC, activate the start-block select signal STB, and activate the burst-length select signal BL8 (which is denoted as "B8" in FIG. 13). A value of the column address YA0 to YA8 inputted at the time T8 is "10".

In response thereto, output of read data is started at a time T12 when a predetermined latency (four clocks in the example shown in FIG. 13) has passed from issuance of the read command R. Read data corresponding to column addresses 10, 11, 8, and 9 of the memory block B are first outputted, and read data corresponding to column addresses 10, 11, 8, and 9 of the memory block C are then outputted. In this way, burst output of eight bits is completed.

As described above, in the data processing system 10 according to the present embodiment, even when the read commands R are successively issued, a burst length can be selected and an output order of read data to be burst-outputted can be selected each time the read command R is issued. Therefore, the first definitions (A12 and A13) that define the burst lengths indicate the numbers of different data (burst output of 12 bits and burst output of 8 bits), respectively. The second definitions (A9 and A11) indicate correspondences between certain elements of data (corresponding to the number of the four registers Reg0 to Reg3 included in the block A of the main amplifier/write driver 64) among plural data (corresponding to the number of the memory cells MC arranged at the respective intersections of the word lines WL and the bit lines B within the memory cell area M in the example shown in FIG. 2) included in the blocks, respectively, and an order of arrangement in the numbers of different data that constitute plural burst lengths, respectively (an arrangement order of the blocks C, and A in the 12-bit data during a period of from the times T4 to T10 in FIG. 13). In plural data bits that constitute a predetermined burst length, the numbers of respective data bits in the blocks C, D, and A are the same. A third definition (YA0 to YA8) indicates definition of the certain elements of data among the plural data (specification of an address; selection).

Figure 14:
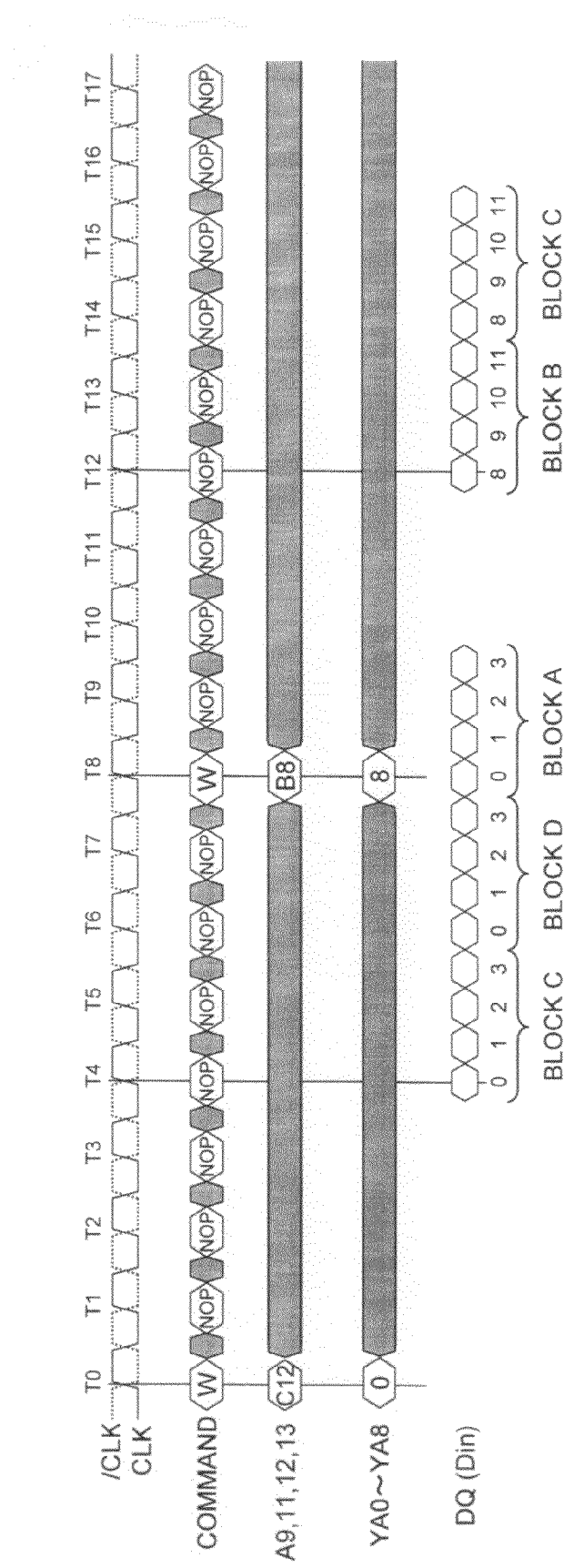
FIG. 14 is a timing chart showing an example of a write operation of the data processing system 10.

FIG. 14 is a timing chart showing an example of the write operation of the data processing system 10 according to the present embodiment.

In the example shown in FIG. 14, write commands W are issued at the times T0 and T8. When the write command W is issued at the time T0, the burst-mode set signals A9 and A11 to A13 inputted at the same time have the same values as those when the read command R is issued at the time T0 in FIG. 13.

In this case, input of write data is started at the time T4 when a predetermined latency (four clocks in the example shown in FIG. 14) has passed from issuance of the write command W. Write data corresponding to the column addresses 0 to 3 of the memory block C are first inputted, write data corresponding to the column addresses 0 to 3 of the memory block D are then inputted, and write data corresponding to the column addresses 0 to 3 of the memory block A are finally inputted. In this way, burst input of 12 bits is completed.

Furthermore, in the example shown in FIG. 14, when the write command W is issued at the time T8, the burst-mode set signals A9 and A11 to A13 inputted at the same time have values that activate the block select signals BSB and BSC, activate the start-block select signals STB, and activate the burst-length select signal BL8 (which is denoted as "B8" in FIG. 14). A value of the column address YA0 to YA8 inputted at the time T8 is "8".

In response thereto, output of write data is started at the time T12 when a predetermined latency (four clocks in the example shown in FIG. 14) has passed from issuance of the write command W. Write data corresponding to the column addresses 8, 9, 10, and 11 of the memory block B are first inputted, and write data corresponding to the column addresses 8, 9, 10, and 11 of the memory block C are then inputted. In this way, burst input of eight bits is completed.

As described above, in the data processing system 10 according to the present embodiment, even when the write commands W are successively issued, a burst length can be selected and an input order of the write data to be burst-inputted can be selected each time the write command W is issued.

While the case where the number of data input/output terminals 14 to be used is fixed (eight in this embodiment) has been explained as an example, the number of data input/output terminals 14 to be used can be made variable.

Figure 15:
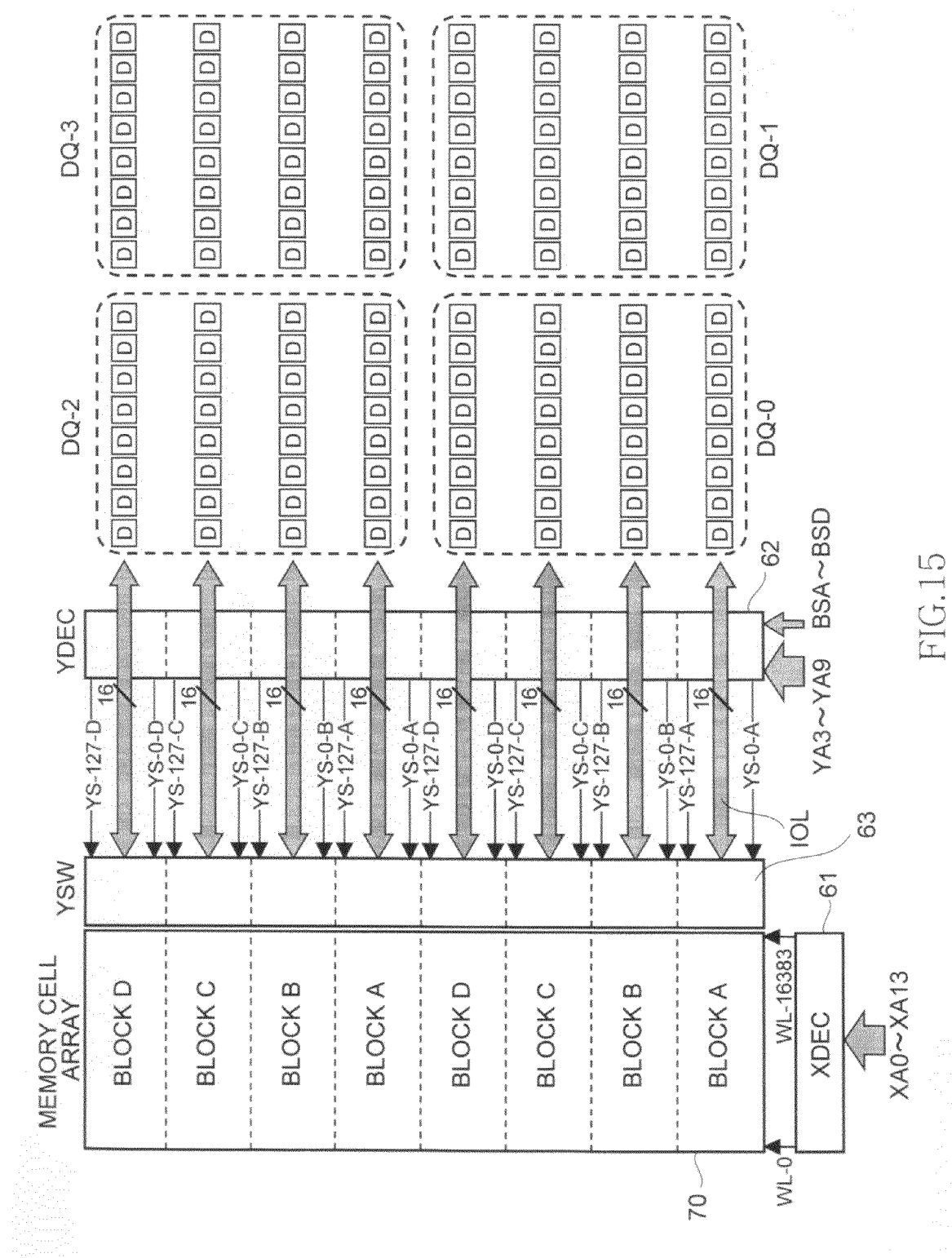
FIG. 15 is a schematic diagram for explaining an operation performed when a mode of using only four data input/output terminals 14 is set.

FIG. 15 is a schematic diagram for explaining an operation performed when a mode of using only the four data input/output terminals 14 (DQ-0 to DQ-3) among the eight data input/output terminals 14 (DQ-0 to DQ-7) is set. The number of data input/output terminals 14 to be used can be selected by a set value in the mode register 53. That is, when a set value of the mode register 53 indicates a first value, an operation mode of using all of the eight data input/output terminals 14 can be set, and when a set value of the mode register 53 indicates a second value, an operation mode of using only four of the data input/output terminals 14 can be set.

When the mode of using only four of the data input/output terminals 14 (DQ-0 to DQ-3) is set, two data input/output terminals 14 (DQ-0 and DQ-1) are assigned to ones of the memory blocks A to D divided into two, respectively, and the remaining two data input/output terminals 14 (DQ-2 and DQ-3) are assigned to the others.

In the example shown in FIG. 15, a burst length is set to 32 bits. When the burst length is set to 32 bits, the block select signals BSA to BSD are all activated and all the memory blocks A to D become targets to be accessed. For example, during the read operation, 32-bit read data that are read from the memory blocks A to D, respectively, are assigned to the four data input/output terminals 14 by eight bits, respectively. In this way, the 32-bit read data outputted to the respective data input/output terminals 14 are burst-outputted in an order specified by the start-block select signal ST and the start-address select signals YA0 to YA2. A column address YA3 to YA9 is used as an address for controlling the column switches YSW. The write operation is performed in an opposite manner.

With this configuration, when the burst length is set to 32 bits, the block select signals BSA to BSD are all activated, and therefore the amplifier circuits AMP in the main amplifier/write driver 64 are all activated during the read operation and the driver circuits DRV in the main amplifier/write driver 64 are all activated during the write operation. The column switches YSW corresponding to the memory blocks A to D are activated based on the column address YA3 to YA9.

Figure 16:
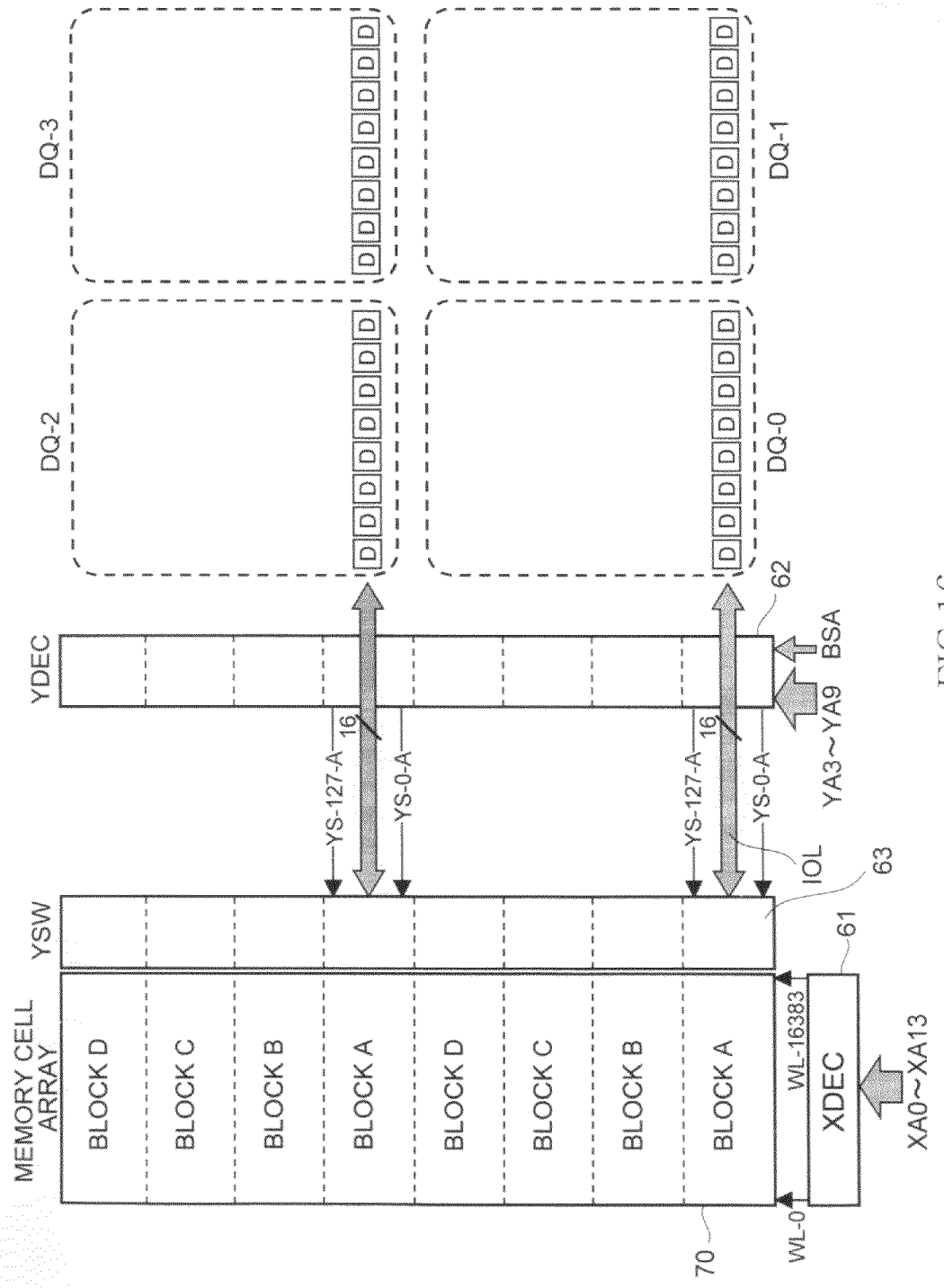
FIG. 16 is a schematic diagram for explaining an operation performed when a burst length is set to eight bits when the mode of using only the four data input/output terminals 14 is set.

FIG. 16 is a schematic diagram for explaining an operation performed when a burst length is set to eight bits when the mode of using only the four data input/output terminals 14 (DQ-0 to DQ3) is set.

When the burst length is set to eight bits, one bit of the block select signals BSA to BSD is activated and corresponding one of the memory blocks A to D becomes a target to be accessed. An example shown in FIG. 16 exemplifies a case where the memory block A is an access target and the memory blocks B to D are not access targets. In this case, during the read operation, 32-bit read data that are read from the memory block A are assigned to the four data input/output terminals 14 by eight bits, respectively. The 8-bit read data outputted to each of the data input/output terminals 14 in this way are burst-outputted in an order specified by the start-address select signals YA0 to YA2. The write operation is performed in an opposite manner.

Figure 17:
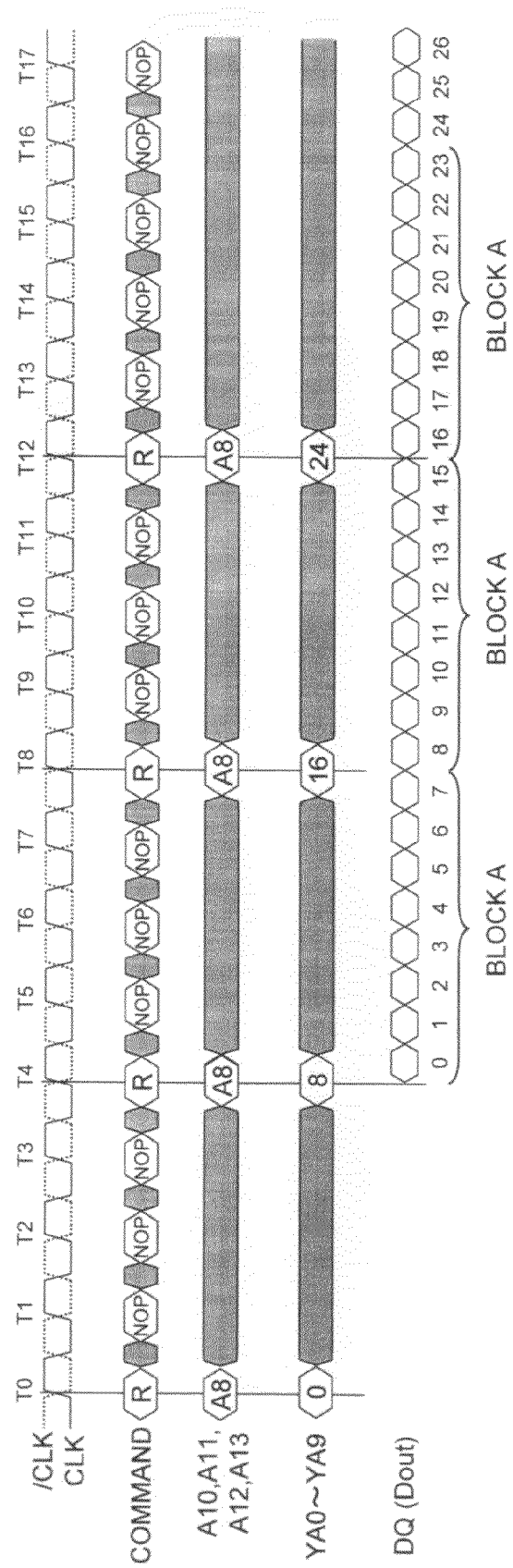
FIG. 17 is a timing chart showing an example of the read operation performed by the data processing system 10 when the mode of using only the four data input/output terminals 14 is set.

FIG. 17 is a timing chart showing an example of the read operation performed by the data processing system 10 when the mode of using only the four data input/output terminals 14 (DQ-0 to DQ-3) is set.

In the example shown in FIG. 17, the read commands R are issued at the times T0, T4, T8, and T12. At any timing when the read command R is issued, the burst-mode set signals A10 to A13 (here, the signal A9 that is used in the case of eight data input/output terminals is used as the column address YA9 and accordingly the signal A10 is used instead of the signal A9 in the case of four data input/output terminals) inputted at the same time as the read command R have values that activate the block select signal BSA, activate the start-block select signal STA, and activate the burst-length select signal BL8 (which is denoted as "A8" in FIG. 17). Values of the column addresses YA0 to YA9 inputted at the times T0, T4, T8, and T12 are "0", "8", "16", and "24", respectively.

In this case, output of read data is started at the time T4 when a predetermined latency (four clocks in the example shown in FIG. 17) has passed from issuance of the read command R, and data are outputted in sequence starting from one corresponding to the column address 0 of the memory block A.

In this way, when intervals between issuance of the read commands R (also of the write commands W) are made equal to the burst length, data can be inputted or outputted without interruption, which enhances use efficiency of the data bus.

FIG. 18 is a block diagram showing an example in which the data processing system according to the present invention is applied by a memory controller (second semiconductor device) and a plurality of DRAM chips (plurality of first semiconductor devices).

As shown in FIG. 18, a data processing system 200 according to the present embodiment includes a plurality of DRAMs 210, 211, . . . and constitutes a data processing system with a plurality of ranks. However, the present embodiment is not limited to a system with plural ranks and can be a one-rank system in which the entire data processing system 200 constitutes one rank. The present embodiment also can be a plural-rank system with a plurality of ranks each of which includes a plurality of DRAMs. Furthermore, one DRAM chip can include a plurality of ranks. Here, a rank indicates a unit in which data are inputted or outputted between a memory controller 310 (the first control circuit) and the DRAMs.

The data processing system 200 further includes a command bus CBus, an address bus ABus, and a data bus DBus. The data processing system 200 is connected to a multi-core processor 300 via these buses. The multi-core processor 300 includes a plurality of (four in this example) cores 301 to 304, the memory controller 310, an on-chip memory 320, and an I/O circuit 330, which are connected with each other via an internal bus 340. The memory controller 310 accesses the data processing system 200 via the command bus CBus, the address bus ABus, and the data bus DBus. The respective DRAMs included in the data processing system 200 are chips that constitute the data processing system 10 as described above. That is, portions of elements that constitute the data processing system of the present invention are integrated on different semiconductor chips, respectively.

Figure 19:
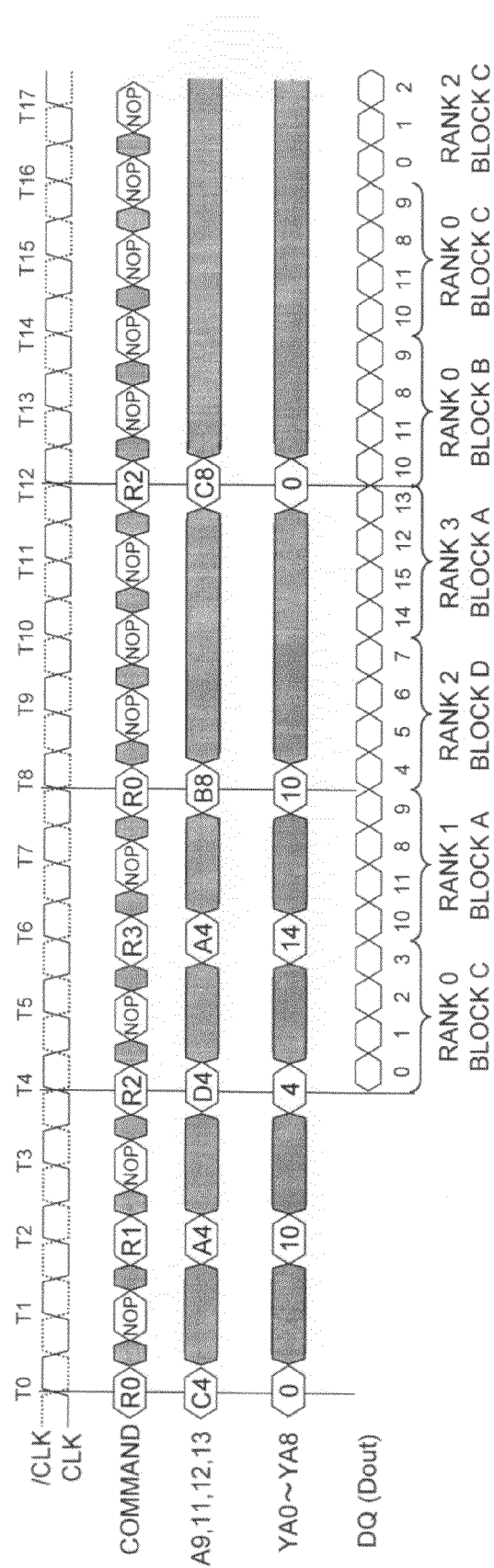
FIG. 19 is a timing chart showing an example of a read operation of a data processing system 200.

FIG. 19 is a timing chart showing an example of the read operation of the data processing system 200 according to the present embodiment.

In the example shown in FIG. 19, the read commands R are issued at the times T0, T2, T4, T6, T8, and T12. These read commands R specify ranks 0, 1, 2, 3, 0, and 2 in this order and are denoted as R0, R1, R2, R3, R0, and R2, respectively. The read command R includes a fourth definition as rank select information for selecting these ranks. The burst-mode set signals A9 and A11 to A13 inputted at the same time as these read commands R are denoted as C4, A4, D4, A4, B8, and C8, respectively, when these signals are denoted by symbols indicating a start block and a burst length. Here, an alphabet indicates a start block and a number indicates a burst length. The column addresses YA0 to YA8 inputted at the same time as the read commands R have values as shown in FIG. 19.

In this case, output of read data is started at the time T4 when a predetermined latency (four clocks in the example shown in FIG. 19) has passed from issuance of the read command R0 at the time T0. An output order of the read data is shown in FIG. 19, and the read data are outputted from specified ranks in specified orders of addresses and blocks, respectively, without interruption.

Figure 20:
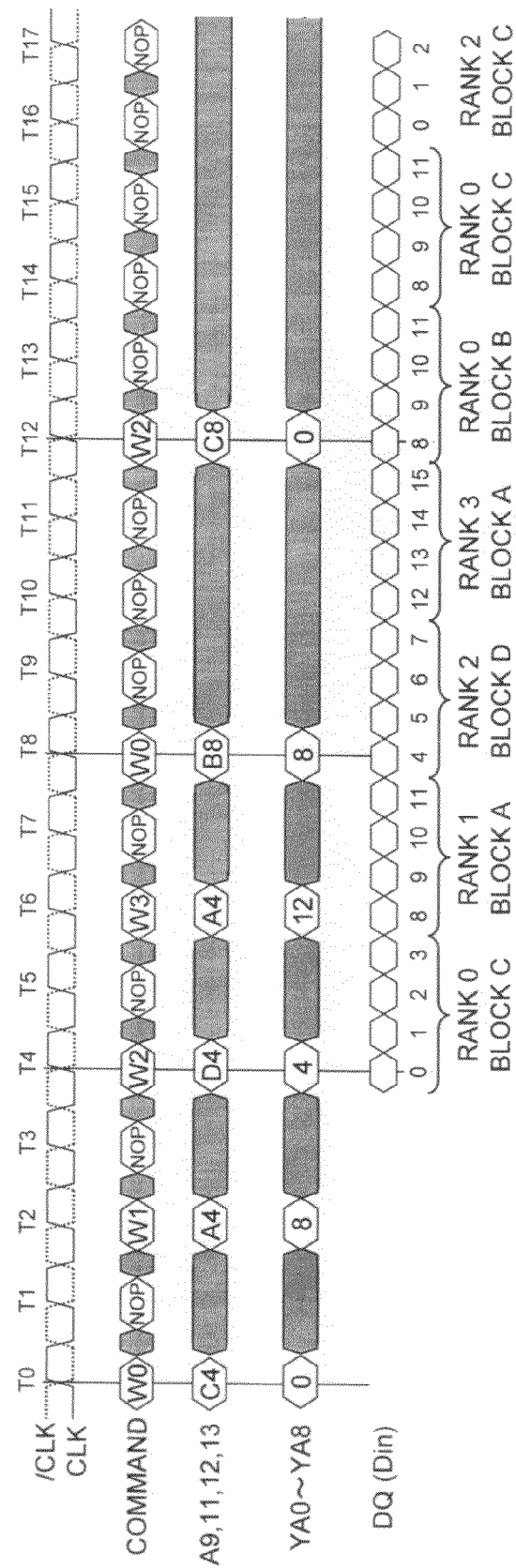
FIG. 20 is a timing chart showing an example of a write operation of the data processing system 200.

FIG. 20 is a timing chart showing an example of the write operation of the data processing system 200 according to the present embodiment.

In the example shown in FIG. 20, the write commands W are issued at the times T0, T2, T4, T6, T8, and T12. These write commands W specify the ranks 0, 1, 2, 3, 0, and 2 in this order and are denoted as W0, W1, W2, W3, W0, and W2, respectively. When the burst-mode set signals A9 and A11 to A13 that are inputted at the same time as the write commands W are denoted by symbols that indicate start blocks and burst lengths, these signals are denoted as C4, A4, D4, A4, B8, and C8, respectively. Values of the column address YA0 to YA8 inputted at the same time as the write commands W are shown in FIG. 20.

In this case, input of write data is started at the time T4 when a predetermined latency (four clocks in the example shown in FIG. 20) has passed from issuance of the write command W0 at the time T0. An input order of the write data is shown in FIG. 20, and the write data are inputted to specified ranks in specified orders of addresses and blocks, respectively, without interruption.

When the data processing system 200 with these ranks is configured to include the plural DRAMs in this manner, continuous data transfer can be achieved without producing a space in the data bus DBus because, even if minimum issuance intervals of the read commands or the write commands for DRAMs that belong to the same rank is equal to or longer than a burst length, the memory controller 310 can access DRAMs that belong to different ranks in the meantime.

It is apparent that the present invention is not limited to the above embodiments, but may be modified and changed without departing from the scope and spirit of the invention.

For example, the respective segment switch circuits of the read-data arranging circuit 65 and the write-data arranging circuit 66 can be controlled by the start-block select signals STA to STD and the burst-length select signals BL4, BL8, BL12, and BL16. This enables the read-data arranging circuit 65 and the write-data arranging circuit 66 to transfer only the number of bits corresponding to each of the burst-length select signals BL4, BL8, BL12, and BL16. For example, in the case of the burst-length select signal BL4, it is possible to reduce power consumption related to transfer to the three registers Reg2 to Reg4 in the serializer 67 and the three registers Reg2 to Reg4 in the deserializer 68, and to the three blocks B to D in the main amplifier/write driver 64 to which no data are transferred. This can be realized only by further adding synthesis logic of the three burst-length select signals BL8, BL12, and BL16 to the start-block select signals STA to STD that control the four switch circuits (TG2STA, TG2STB, TG2STC, and TG2STD) in the switching circuit TG2, respectively, for example. Similarly, it suffices that synthesis logic of the two burst-length select signals BL12 and BL16 is further added to the start-block select signals STA to STD that control the four switch circuits TG3STA, TG3STB, TG3STC, and TG3STD) in the switching circuit TG3, respectively. It also suffices that synthesis logic of the burst-length select signal BL16 is further added to the start-block select signals STA to STD that control the four switch circuits (TG4STA, TG4STB, TG4STC, and TG4STD) in the switching circuit TG4, respectively.

In the above embodiment, the explanations have been given of the case in which the read-data arranging circuit 65 and the write-data arranging circuit 66 are circuits for the corresponding serializer 67 and deserializer 68, respectively. However, the read-data arranging circuit 65 and the write-data arranging circuit 66 can be compressed into one. This enables to realize reduction in a circuit area when the data processing system 10 performs exclusive operations in a read mode and a write mode. Furthermore, the serializer 67 and the deserializer 68 can be compressed into one.

For example, the present invention can be applied to systems with a data processing function or can be applied to systems such as a SOC (System on Chip), a MCP (Multi Chip Package), and a POP (Package on Package). The technical concepts of the present application can be applied to the SOC in a relation between the cores 301 to 304 and the on-chip memory 320 shown in FIG. 18, for example. The present invention can be also applied to semiconductor devices such as a central processing unit (CPU), a micro controller unit (MCU), and a digital signal processor (DSP). Furthermore, circuit formats of the read-data arranging circuit 65 and the like are not limited to those of transfer gates as disclosed in the above embodiment.

When an FET (Field Effect Transistor) is used as the transistor in the present invention, various types of FETs such as MIS (Metal-Insulator Semiconductor) and TFT (Thin Film Transistor) can be used as well as MOS (Metal Oxide Semiconductor). As the transistor, other than FETS, various types of transistors such as a bipolar transistor can be also used. Further, some of the transistors can be bipolar transistors, or transistors other than the FET can be used.

In addition, an NMOS transistor (N-channel MOS transistor) is a representative example of a first conductive transistor, and a PMOS transistor (P-channel MOS transistor) is a representative example of a second conductive transistor.

In the present invention, it is not always necessary that the data terminals from which the read data are outputted and the data terminals to which the write data are inputted be common terminals (the data input/output terminals), and data terminals dedicated for reading and data terminals for dedicated for writing can be separately provided. The memory cells MC can be nonvolatile.

In the present invention, it is not essential that the memory blocks, the main amplifier, and the read-data arranging circuit that constitute the back end portion, and the serializer, the deserializer, the data input/output circuit and the like that constitute the front end portion be integrated on a single semiconductor chip. The back end portion and the front end portion can be integrated on different chips, respectively. In this case, one semiconductor chip constituting the front end portion can be assigned to several semiconductor chips each constituting the back end portion.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. An apparatus comprising:
   a first semiconductor device; and
   a second semiconductor device coupled to each other, the first semiconductor device comprising a plurality of memory blocks, each including a plurality of memory cells, and
   the second semiconductor device comprising a control circuit that is configured to issue an access request to the first semiconductor device with producing and supplying to the first semiconductor device a command and a burst operation mode simultaneously with each other, the command designating a data read or a data write operation, and the burst operation mode including first information and second information, the first information indicating a burst length that designates a first number of data that are to be transferred in series between the first and second semiconductor devices, and the second information indicating a block selection that designates one of the memory blocks of the first semiconductor device as a start block,
   wherein:
      when the first number is not greater than a second number, the first number of data, that are to be transferred in series between the first and second semiconductor devices, are read out from or written into the first number of memory cells each included in the start block of the memory blocks, and
      when the first number is greater than the second number, the first number of data, that are to be transferred in series between the first and second semiconductor devices, are read out from or written into the second number of memory cells, each included in the start block of the memory blocks, and a third number of memory cells, each included in remaining block or blocks of the memory blocks, the third number being the first number minus the second number.

2. The apparatus as claimed in claim 1, wherein when the first number is greater than two times the second number, the first number of data, that are to be transferred in series between the first and second semiconductor devices, are read out from or written into the second number of memory cells each included in the start block of the memory blocks, the second number of memory cells each included in a first one of remaining blocks of the memory blocks and a fourth number of memory cells each included in second one or ones of the remaining blocks of the memory blocks, the fourth number being the first number minus two times the second number.

3. The apparatus as claimed in claim 1, wherein the control circuit of the second semiconductor device is configured to issue the access request a plurality of times such that the burst length designated by the first information accompanying an earlier access request is different from the burst length designated by the first information accompanying a later access request.

4. The apparatus as claimed in claim 1, wherein the control circuit of the second semiconductor device is configured to issue the access request a plurality of times such that the start block designated by the second information accompanying an earlier access request is different from the burst length designated by the second information accompanying a later access request.

5. The apparatus as claimed in claim 1, wherein the burst operation mode includes the first information and the second information as a coded mode data, the burst length and the start block being variable in accordance with contents of the coded mode data.

6. The apparatus as claimed in claim 5, wherein the first semiconductor device further comprises a decoding circuit that decodes the coded mode data to produce a first set of signals indicative of the burst length and a second set of signals indicative of the start block.

7. The apparatus as claimed in claim 1, wherein the control circuit that is configured to issue the access request to the first semiconductor device with producing and supplying to the first semiconductor device address information simultaneously with the command and the burst operation mode, a part of the address information indicating a cell selection that designates one of the memory cells each included in the start block of the memory blocks as a start cell so that a leading one of the first number of data, that are to be transferred in series between the first and second semiconductor devices, is read out from or written into the start cell of the first number of memory cells each included in the start block of the memory block when the first number is not greater than the second number, and read out from or written into the start cell of the second number of memory cells each included in the start block of the memory block when the first number is greater than the second number.

8. The apparatus as claimed in claim 7,
wherein the burst operation mode includes the first information and the second information as a coded mode data, the burst length and the start block being variable in accordance with contents of the coded mode data, and
wherein the first semiconductor device further comprises a set of address terminals, a first part of the set of address terminals is supplied with the address information and a second part of the set of address terminals is supplied with the coded mode data.

9. An apparatus comprising:
a first semiconductor device; and
a second semiconductor device coupled to each other,
the first semiconductor device comprising a plurality of memory blocks, each including a plurality of memory cells;
the second semiconductor device comprising a control circuit that is configured to issue an access request to the first semiconductor device with supplying the first semiconductor device with command information and burst operation mode information simultaneously with each other, the command information designating a data read or a data write operation, and the burst operation mode information including a burst length that designates a first number of data that are to be transferred in series between the first and second semiconductor devices and a block selection that designates one of the memory blocks of the first semiconductor device as a start block, and
the first semiconductor device further comprising:
a set of first terminals coupled to the second semiconductor device to receive the command information and the burst operation mode information simultaneously with each other;
a second terminal coupled to the second semiconductor device to transfer the first number of data in series between the first and second semiconductor devices; and
a data access circuit coupled to the memory blocks, the set of first terminals and the second terminal, the data access circuit being configured to access, when the first number is not greater than a second number, the first number of memory cells each included in the start block of the memory blocks in parallel to each other, and to access, when the first number is greater than the second number, the second number of memory cells each included in the start block of the memory blocks in parallel to each other and a third number of memory cells each included in remaining one or ones of the memory blocks in parallel to each other, the third number being the first number minus the second number,
wherein:
when the first number is not greater than the second number, the first number of data, that are to be transferred in series between the first and second semiconductor devices, are read out from or written into the first number of memory cells each included in the start block of the memory blocks, and
when the first number is greater than the second number, the first number of data, that are to be transferred in series between the first and second semiconductor devices, are read out from or written into the second number of memory cells each included in the start block of the memory blocks and the third number of memory cells each included in the remaining block or blocks of the memory blocks.

10. The apparatus as claimed in claim 9, wherein the data access circuit of the first semiconductor device comprises:
a de-serializing circuit that is configured to convert the first number of data, that are transferred in series from the second semiconductor device, into first parallel data, the first parallel data being written at one time into the first number of memory cells each included in the start block of the memory blocks when the first number is not greater than the second number, and into the second number of memory cells each included in the start block of the memory blocks and into the third number of memory cells each included in the remaining one or ones of the memory blocks when the first number is greater than the second number; and
a serializing circuit that is configured to convert, when the first number is not greater than the second number, a second parallel data, that are read out at one time from the first number of memory cells each included in the start block of the memory blocks, and when the first number is greater than the second number, a third parallel data, that are read out at one time from the second number of memory cells each included in the start block of the memory blocks and from the third number of memory cells each included in the remaining one or ones of the memory blocks, respectively into the first number of data, that are transferred in series to the second semiconductor device.

11. The apparatus as claimed in claim 10, wherein the data access circuit comprises:
a first arranging circuit that is configured to form electrical paths, when the first number is not greater than the second number, from the de-serializing circuit to the start block of the memory blocks to supply the first parallel data to the start block, and when the first number is greater than the second number, from the de-serializing circuit to each of the start block and the remaining one or ones of the memory blocks to supply a leading part and a rest part of the first parallel data to the start block and the remaining one or ones of the memory blocks, respectively; and
a second arranging circuit that is configured to form electrical paths, when the first number is not greater than the second number, from the start block of the memory blocks to the serializing circuit to supply the second parallel data thereto, and when the first number is greater than the second number, from each of the start block and the remaining one or ones of the memory blocks to the de-serializing circuit to supply the third parallel data thereto.

12. The apparatus as claimed in claim 9, wherein the first semiconductor device is fabricated on a first single semiconductor chip and the second semiconductor device is fabricated on a second single semiconductor chip that is different from the first semiconductor chip.

13. The apparatus as claimed in claim 9, wherein the first semiconductor device further comprises a mode register, and the burst operation mode information is supplied to the data access circuit without being temporarily stored into the mode register.

14. The apparatus as claimed in claim 13, wherein the second semiconductor device produces and supplies mode data independently of the burst operation mode information, the mode data being temporarily stored into the mode register.

15. The apparatus as claimed in claim 14, wherein the set of first terminals of the first semiconductor device includes a set of command terminals and a set of address terminals, the set of command receiving the command information, and the set of address terminal receiving the burst operation mode information when the command information is supplied to the set of command terminals and the mode data when the first semiconductor device enters into a mode register set.

16. The apparatus as claimed in claim 9, wherein the memory blocks of the first semiconductor device is controlled in a recurring manner.

17. The apparatus as claimed in claim 9, wherein each of the memory blocks includes a plurality of word lines, a plurality of bit lines and a plurality of memory cells each connected to an associated one of the word lines and an associated one of the bit lines, and each the word lines of one of the memory blocks is connected in common to a corresponding one of the word lines of each of remaining ones of the memory blocks.

18. An apparatus comprising:
a memory cell array including a plurality of word lines, a plurality bit lines and a plurality of memory cells each connected to associated ones of the word and bit lines, one of the word lines being selected in response to an access request as a selected word line, plural ones of the memory cells that are connected to the selected word line being selected as selected memory cells, the bit lines that are connected respectively to the selected memory cells being divided into first and second bit line blocks each including corresponding ones of the bit lines;
a plurality of data lines, the data lines being divided into first and second data line groups each including corresponding ones of the data lines, the data lines belonging to the first data line group being smaller in number than the bit lines belonging to the first bit line block, the data lines belonging to the second data line group being smaller in number than the bit lines belonging to the second bit line block;
a column switch circuit supplied with block selection information and configured to electrically connect designated ones of the bit lines belonging to the first bit line block to the data lines belonging to the first data line group, respectively, with electrically disconnecting the bit lines belonging to the second bit line block from the data lines belonging to the second data line group, when the block selection information takes a first state to represent a first burst length, and to electrically connect the designated ones of the bit lines belonging to the first bit line block to the data lines belonging to the first data line group, respectively, and designated ones of the bit lines belonging to the second bit line block to the data lines belonging to the second data line group, respectively, when the block selection information takes a second state to represent a second burst length that is greater than the first burst length;
a data terminal;
a serializing circuit electrically coupled between the data terminal and the first and second data line groups, the serializing circuit being configured to respond to the first burst length to perform a first parallel-to-serial conversion operation in which first data signals supplied in parallel to the first data line group from the first bit line block through the column switch circuit are transferred in series to the data terminal and to respond to the second burst length to perform a second parallel-to-serial conversion operation in which second data signals supplied in parallel to the first and second data line groups from the first and second bit line blocks through the column switch circuit are transferred in series to the data terminal; and
a de-serializing circuit electrically coupled between the data terminal and the first and second data line groups, the de-serializing circuit being configured to respond to the first burst length to perform a first serial-to-parallel conversion operation in which third data signals supplied in series from the data terminal are transferred in parallel to the first data line group and to respond to the second burst length to perform a second serial-to-parallel conversion operation in which fourth data signals supplied in series from the date terminal are transferred in parallel to the first and second data line groups, the third data signals being conveyed from the data lines belonging to the first data line group to the bit lines belonging to the first bit line block through the column switch circuit, respectively, and the fourth data signals being conveyed from the data lines belonging to the first and second data line groups to the bit lines belonging to the first and second bit line blocks through the column switch circuit, respectively.

19. The apparatus as claimed in claim 18, wherein the block selection information includes a variable content to take a selected one of the first and second states.

20. The apparatus as claimed in claim 18, wherein the memory cell array, the plurality of data lines, the column switch circuit, the data terminal, the serializing circuit, and the de-serializing circuit are fabricated on a single semiconductor chip.

\* \* \* \* \*